(12) United States Patent
Leobandung

(10) Patent No.: US 8,969,149 B2
(45) Date of Patent: Mar. 3, 2015

(54) STACKED SEMICONDUCTOR NANOWIRES WITH TUNNEL SPACERS

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 100 days.

(21) Appl. No.: 13/893,896

(22) Filed: May 14, 2013

(65) Prior Publication Data

US 2014/0339611 A1 Nov. 20, 2014

(51) Int. Cl.
*H01L 21/8238* (2006.01)
*H01L 29/06* (2006.01)
*H01L 29/66* (2006.01)
*H01L 29/78* (2006.01)

(52) U.S. Cl.
CPC ...... *H01L 29/0669* (2013.01); *H01L 29/66477* (2013.01); *H01L 29/78* (2013.01)
USPC ........... 438/212; 438/214; 438/216; 438/217; 438/218; 257/18

(58) Field of Classification Search
USPC ................. 438/151, 209, 212, 214, 216–218; 257/18; 911/712, 767
See application file for complete search history.

(56) References Cited

U.S. PATENT DOCUMENTS

| | | | |
|---|---|---|---|
| 7,416,993 B2 * | 8/2008 | Segal et al. | 438/742 |
| 7,585,716 B2 | 9/2009 | Cheng | |
| 7,892,945 B2 | 2/2011 | Bedell et al. | |
| 7,948,082 B2 * | 5/2011 | Segal et al. | 257/746 |
| 8,084,308 B2 * | 12/2011 | Chang et al. | 438/151 |
| 8,216,902 B2 * | 7/2012 | Chang et al. | 438/275 |
| 8,541,274 B1 * | 9/2013 | Xie et al. | 438/212 |
| 2010/0006955 A1 | 1/2010 | Takimoto et al. | |

OTHER PUBLICATIONS

Dupre, C., et al., "15nm-diameter 3D Stacked Nanowires with Independent Gates Operation: Phi FET", Proc. Electron Devices Meeting, Dec. 15-17, 2008, IEDM 2008. IEEE International, pp. 1-4.

* cited by examiner

*Primary Examiner* — Thanh V Pham
(74) *Attorney, Agent, or Firm* — Scully, Scott, Murphy & Presser, P.C.; Louis J. Percello, Esq.

(57) ABSTRACT

A structure is provided that includes at least one multilayered stacked semiconductor material structure located on a semiconductor substrate and at least one sacrificial gate material structure straddles a portion of the at least one multilayered stacked semiconductor structure. The at least one multilayered stacked semiconductor material structure includes alternating layers of sacrificial semiconductor material and semiconductor nanowire template material. End segments of each layer of sacrificial semiconductor material are then removed and filled with a dielectric spacer. Source/drain regions are formed from exposed sidewalls of each layer of semiconductor nanowire template material, and thereafter the at least one sacrificial gate material structure and remaining portions of the sacrificial semiconductor material are removed suspending each semiconductor material. A gate structure is formed within the areas previously occupied by the at least one sacrificial gate material structure and remaining portions of the sacrificial semiconductor material.

10 Claims, 22 Drawing Sheets

US 8,969,149 B2

STACKED SEMICONDUCTOR NANOWIRES WITH TUNNEL SPACERS

BACKGROUND

The present application relates to a semiconductor structure and a method of forming the same. More particularly, the present application relates to a semiconductor nanowire field effect transistor with reduced parasitic capacitance and a method of forming the same.

The use of non-planar semiconductor devices such as, for example, FinFETs, trigate and semiconductor nanowire field effect transistors (FETs) is the next step in the evolution of complementary metal oxide semiconductor (CMOS) devices. A semiconductor nanowire with a partially or a totally surrounding gate is one ideal architecture for off-current reduction in sub-45 nm technologies. A gate-all semiconductor nanowire configuration enables to relax channel film thickness requirements for a target leakage control. Stacked semiconductor nanowires yield very high current levels per layout surface area overcoming the current limit imposed by a small width to pitch ratio. Despite providing very high current levels, prior art stacked semiconductor nanowires have a high parasitic capacitance associated therewith.

SUMMARY

In one aspect of the present application, a method of forming a semiconductor structure having reduced parasitic capacitance is provided. The method of the present application includes providing at least one multilayered stacked semiconductor material structure on a semiconductor substrate and at least one sacrificial gate material structure straddling a portion of the at least one multilayered stacked semiconductor structure. In accordance with the present application, the at least one multilayered stacked semiconductor material structure includes alternating layers of a sacrificial semiconductor material and a semiconductor nanowire template material, wherein the sacrificial semiconductor material is different from the semiconductor nanowire template material. End segments of each layer of sacrificial material are then replaced with a dielectric spacer. Source/drain regions are formed from exposed sidewall surfaces of each layer of semiconductor nanowire template material and on opposite sides of the at least one sacrificial gate material structure. Next, each sacrificial gate material structure and remaining portions of the sacrificial semiconductor material are removed suspending each semiconductor nanowire template material. A gate structure is formed within the areas previously occupied by the at least one sacrificial gate material structure and remaining portions of the sacrificial semiconductor material.

In another aspect of the present application, a semiconductor structure is provided that has reduced capacitance. The structure includes at least one stacked semiconductor nanowire array suspended above a surface of a semiconductor substrate, wherein the at least one stacked semiconductor nanowire array includes a plurality of vertically spaced apart semiconductor nanowires. The structure also includes a tunnel spacer located beneath and at end portions of each vertically spaced apart semiconductor nanowire of the at least one stacked semiconductor nanowire array, wherein a sidewall surface of each tunnel spacer is vertically coincident with a sidewall surface of each vertically spaced apart semiconductor nanowire of the at least one stacked semiconductor nanowire array. The structure also includes a first gate structure located above a topmost vertically spaced apart semiconductor nanowire of the at least one stacked semiconductor nanowire array. The structure further includes a second gate structure located beneath each vertically spaced apart semiconductor nanowire of the at least one stacked semiconductor nanowire array and located between each tunnel spacer.

DETAILED DESCRIPTION

Figure 1:
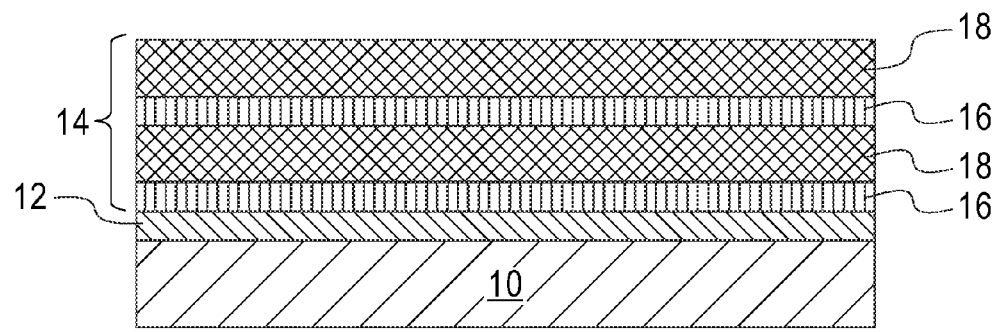
FIG. 1 is a cross-sectional view of an initial structure containing a semiconductor substrate having a base sacrificial semiconductor layer located on a surface of the semiconductor substrate, and a semiconductor material stack located on the base sacrificial semiconductor layer and comprising alternating layers of a sacrificial semiconductor material and a semiconductor nanowire template material that can be employed in one embodiment of the present application.
Figure 2A:
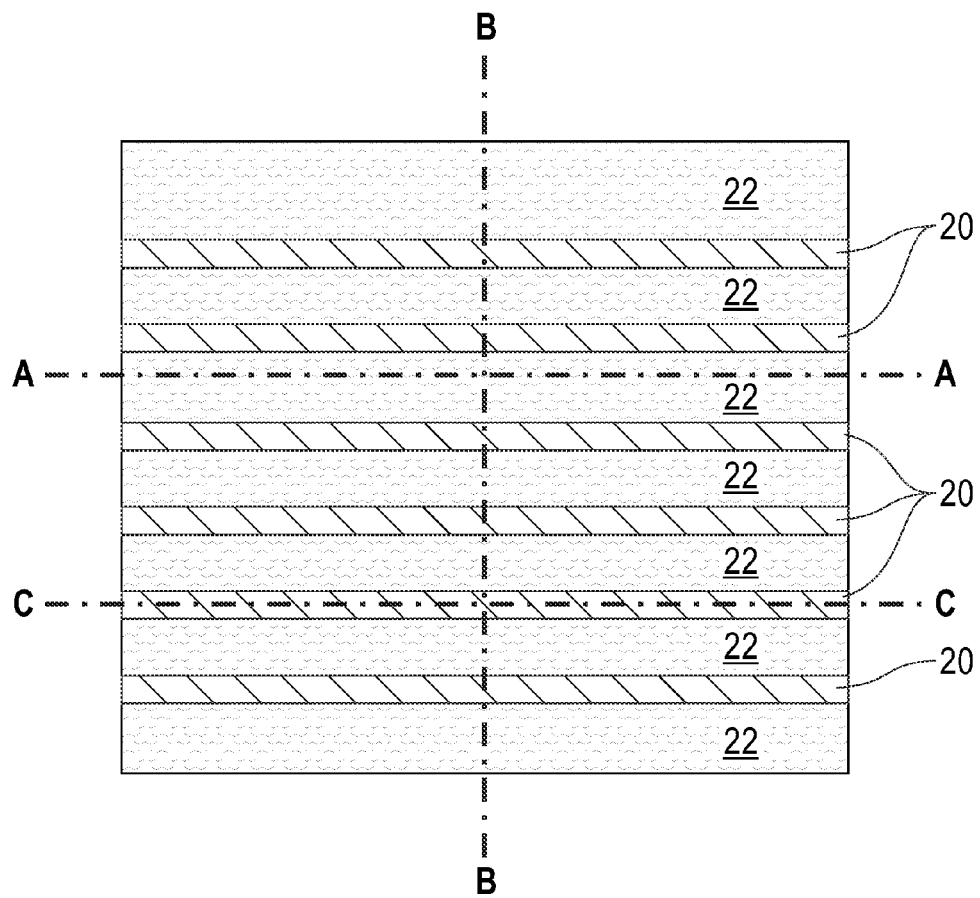
FIG. 2A is a top-down view of the structure shown in FIG. 1 after formation of at least one multilayered stacked semiconductor material structure which includes a remaining portion of the base sacrificial semiconductor layer, and remaining portions of alternating layers of the sacrificial semiconductor material and the semiconductor nanowire template material, and formation of trench isolation structures.
Figure 2B:
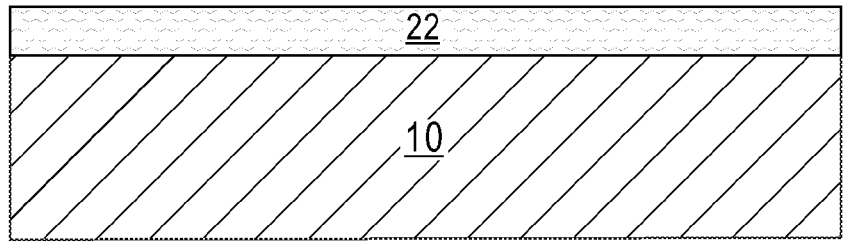
FIG. 2B is a vertical cross sectional through line A-A shown in FIG. 2A.
Figure 2C:
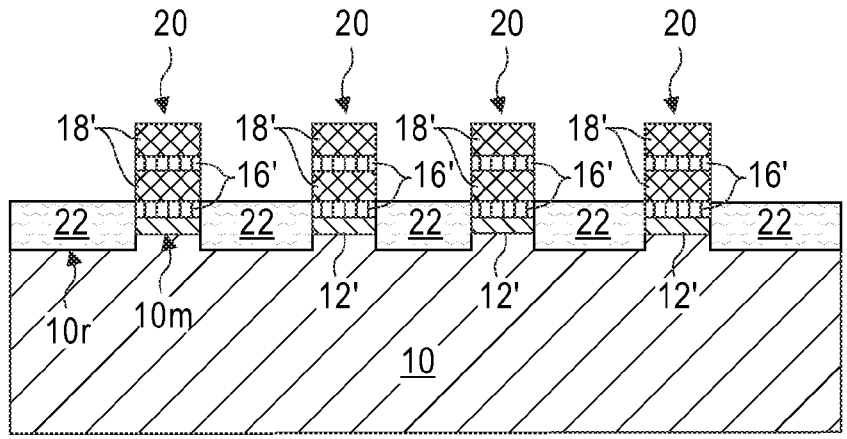
FIG. 2C is a vertical cross sectional view through line B-B shown in FIG. 2A.
Figure 2D:
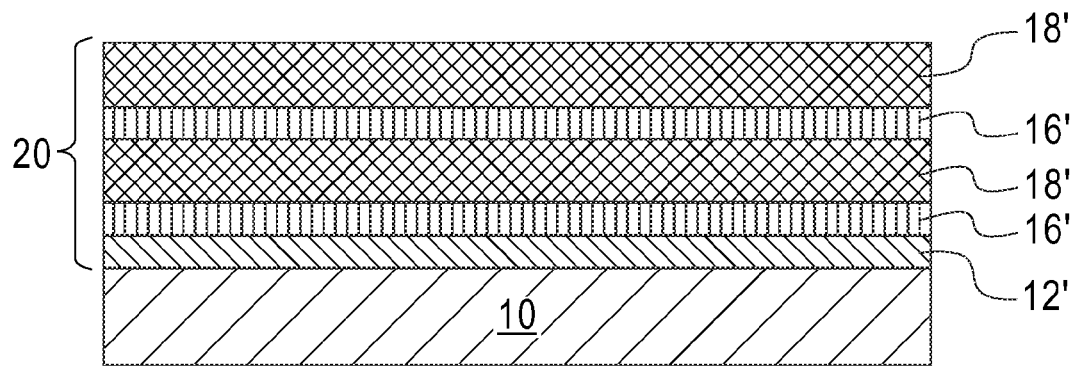
FIG. 2D is a vertical cross sectional view through line C-C shown in FIG. 2A.
Figure 3A:
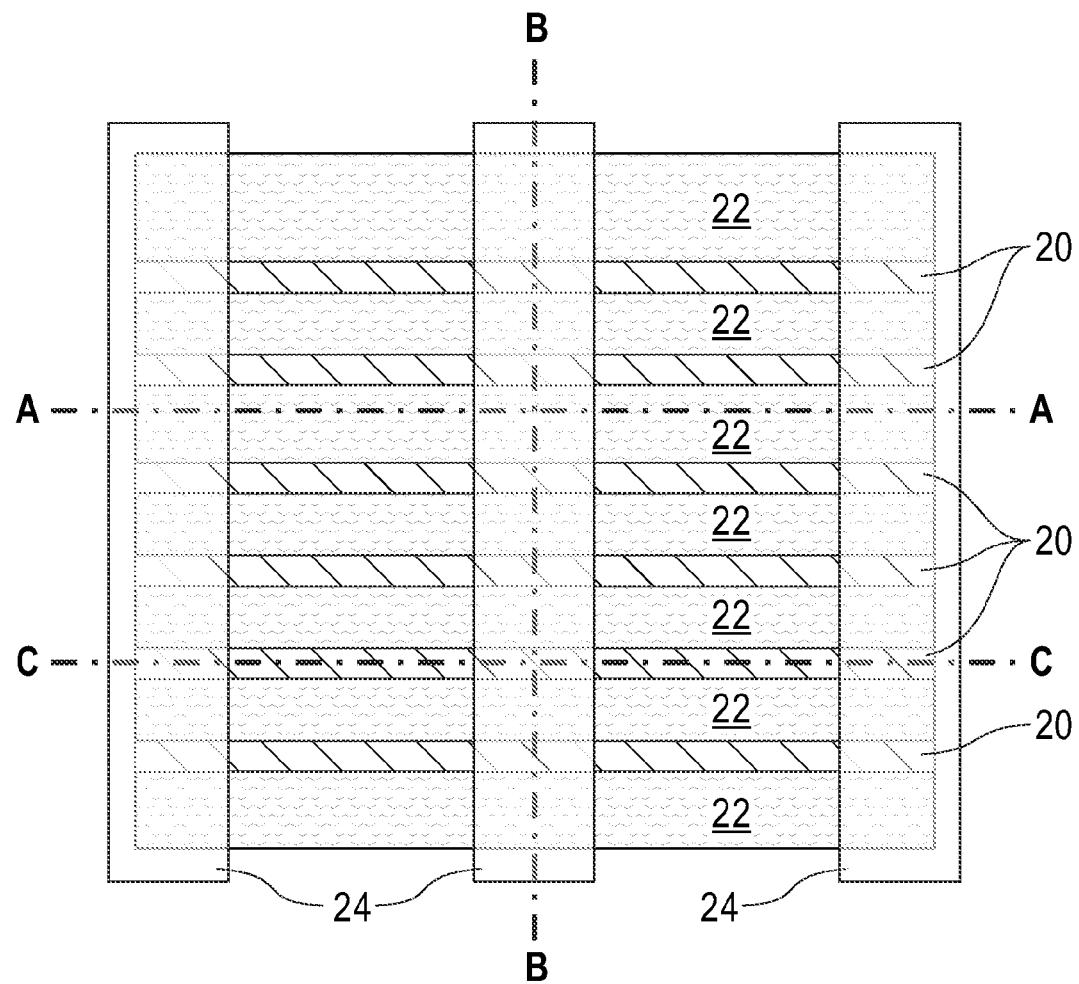
FIG. 3A is a top-down view of the structure shown in FIG. 2A after forming at least one sacrificial gate material structure on exposed portions of each trench isolation structure and straddling each multilayered stacked semiconductor material structure.
Figure 3B:
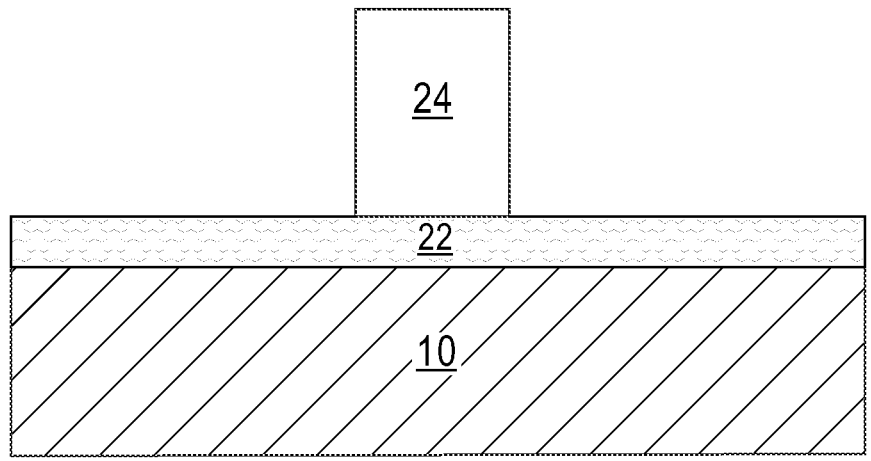
FIG. 3B is a vertical cross sectional through line A-A shown in FIG. 3A.
Figure 3C:
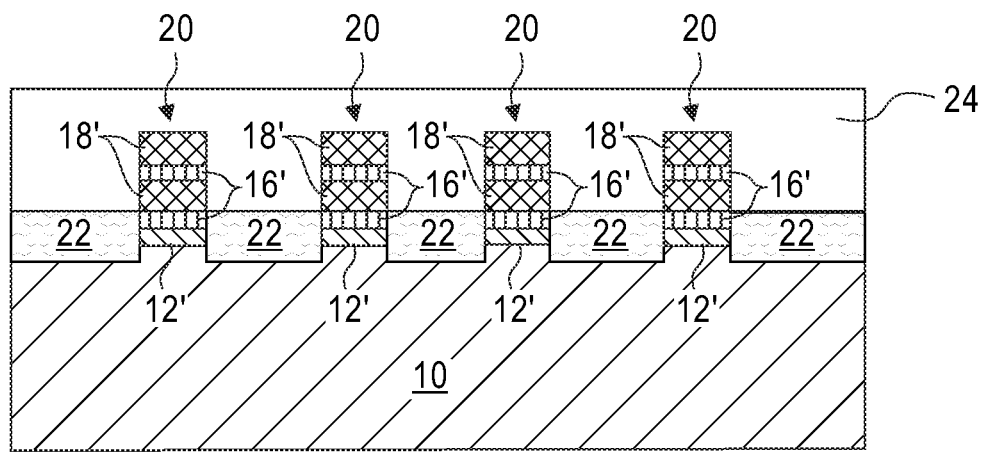
FIG. 3C is a vertical cross sectional view through line B-B shown in FIG. 3A.
Figure 3D:
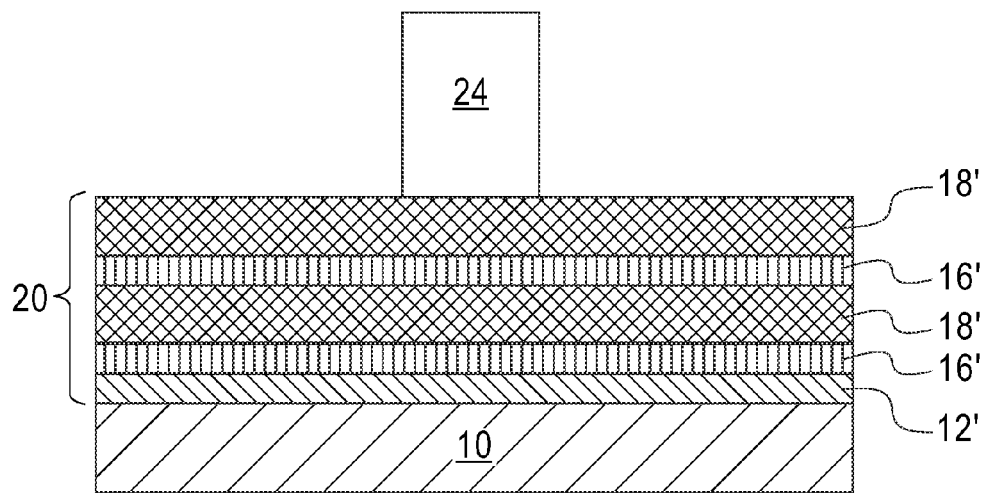
FIG. 3D is a vertical cross sectional view through line C-C shown in FIG. 3A.
Figure 4A:
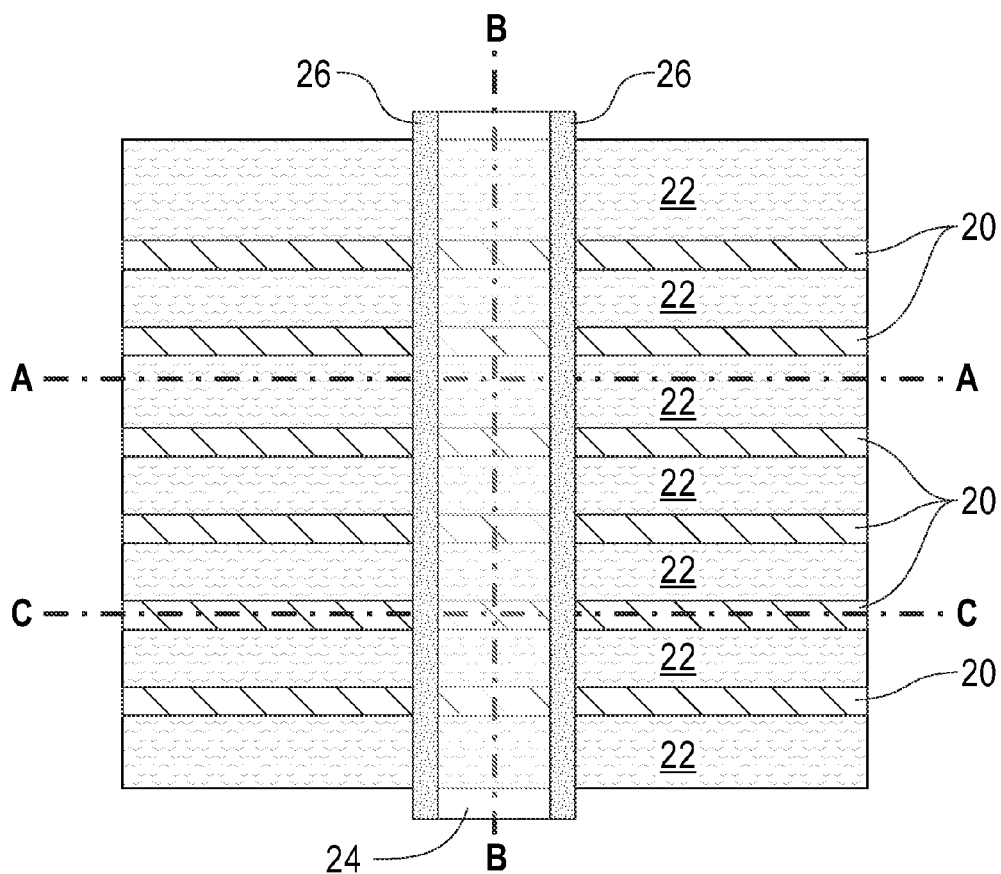
FIG. 4A is a top-down view of the structure shown in FIG. 3A after forming a first spacer on exposed sidewall surfaces of each sacrificial gate material structure.
Figure 4B:
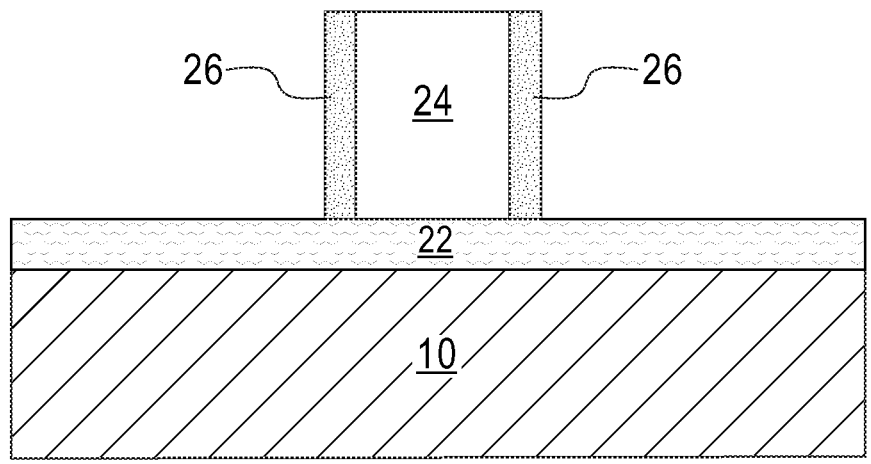
FIG. 4B is a vertical cross sectional through line A-A shown in FIG. 4A.
Figure 4C:
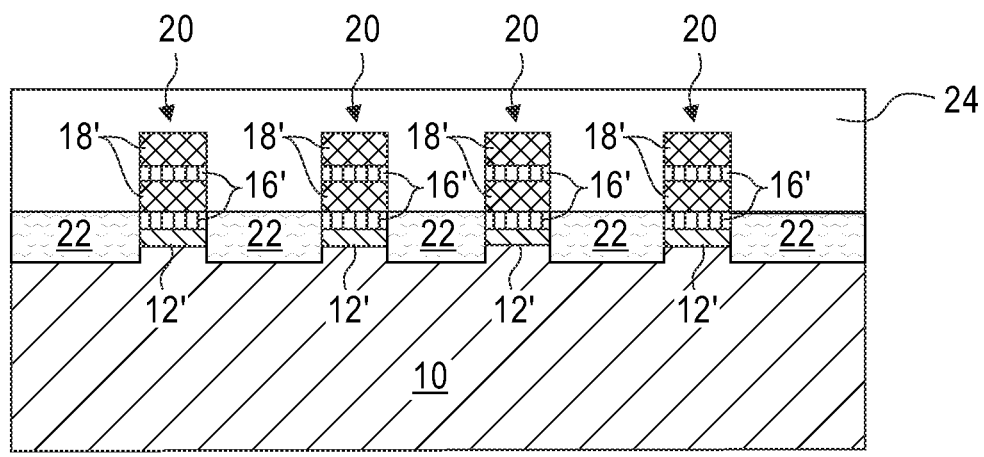
FIG. 4C is a vertical cross sectional view through line B-B shown in FIG. 4A.
Figure 4D:
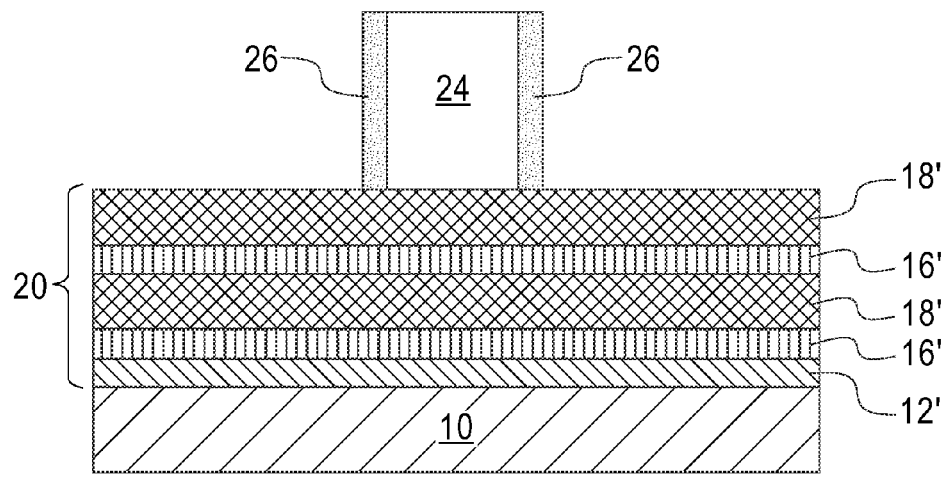
FIG. 4D is a vertical cross sectional view through line C-C shown in FIG. 4A.
Figure 5A:
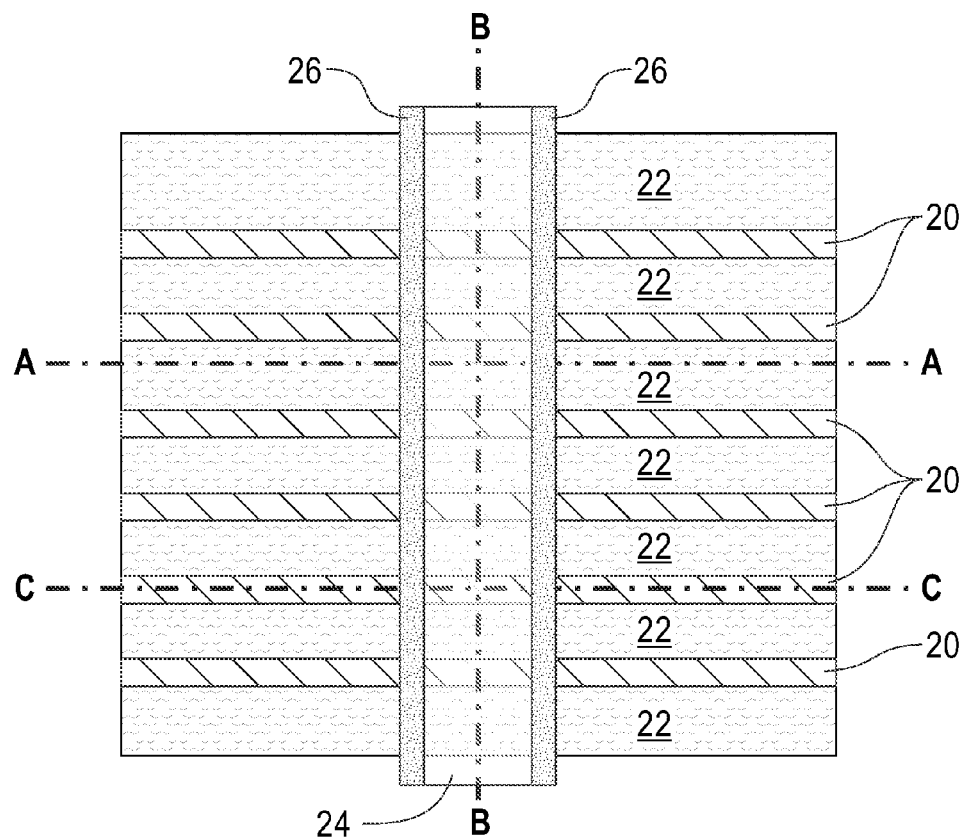
FIG. 5A is a top-down view of the structure shown in FIG. 4A after removing end segments of each remaining portion of sacrificial semiconductor material from each multilayered stacked semiconductor material structure.
Figure 5B:
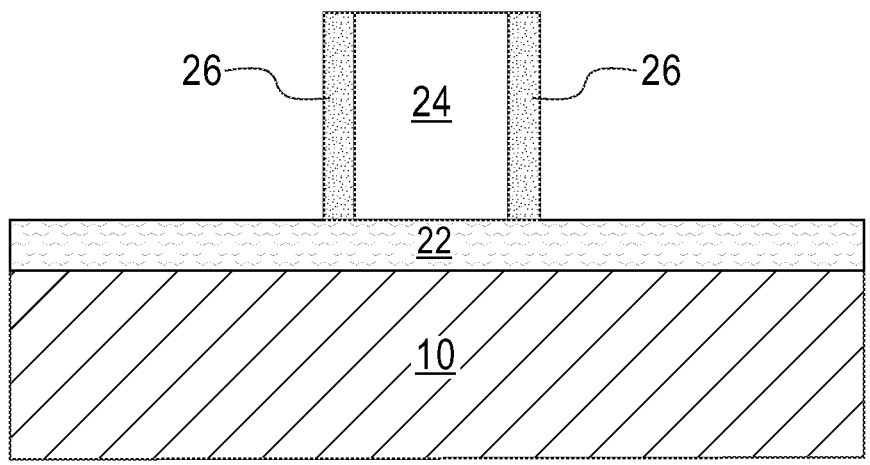
FIG. 5B is a vertical cross sectional through line A-A shown in FIG. 5A.
Figure 5C:
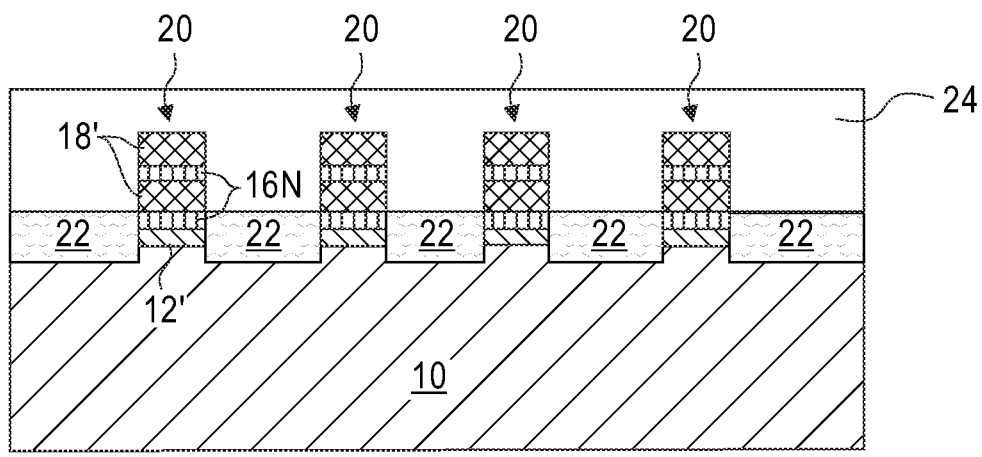
FIG. 5C is a vertical cross sectional view through line B-B shown in FIG. 5A.
Figure 5D:
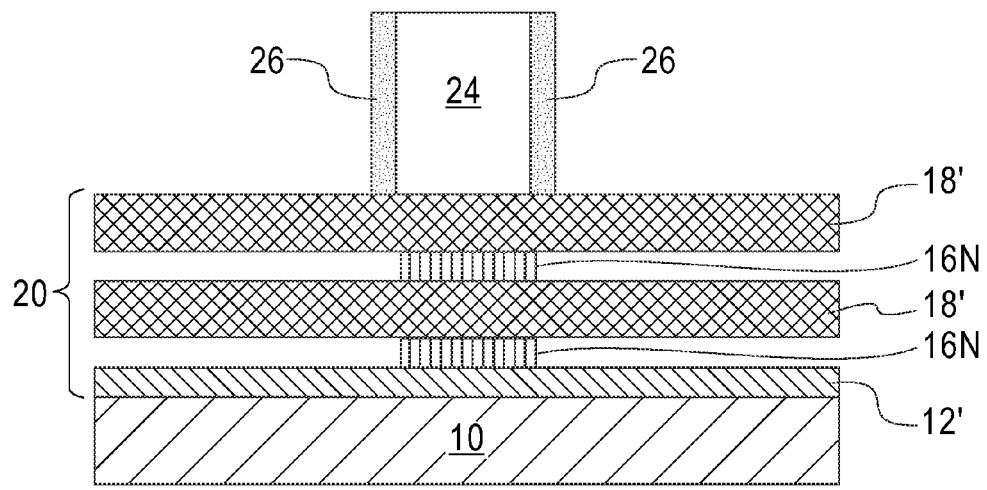
FIG. 5D is a vertical cross sectional view through line C-C shown in FIG. 5A.
Figure 6A:
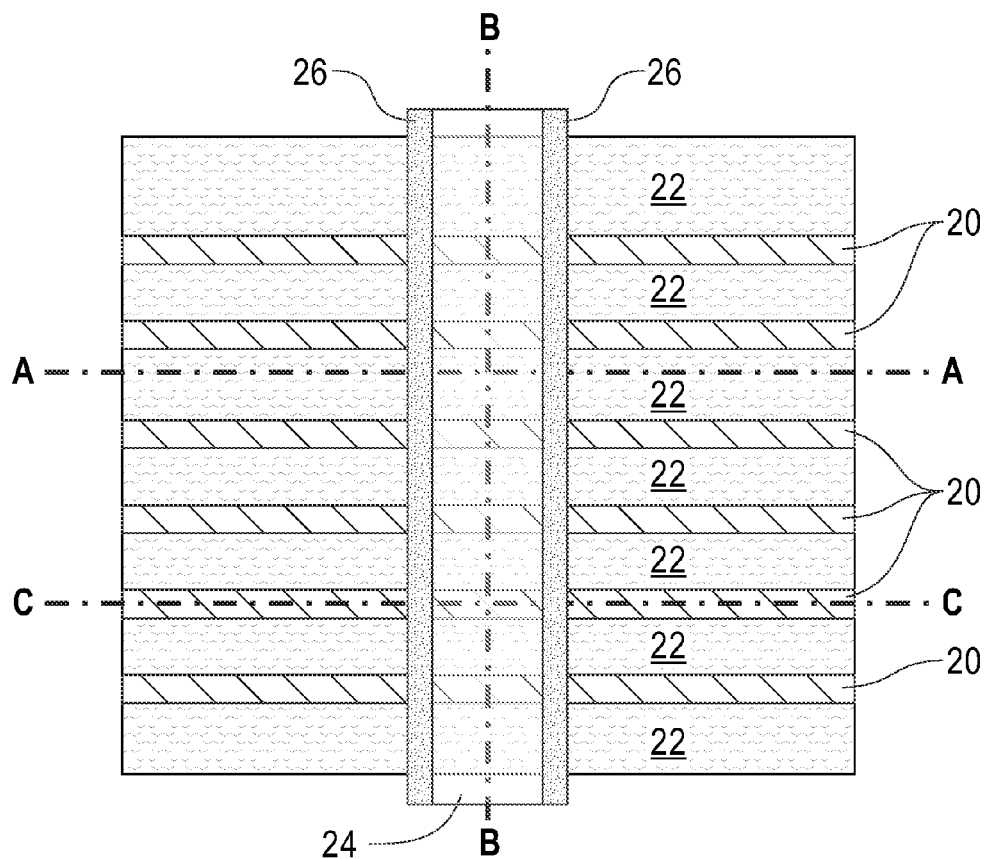
FIG. 6A is a top-down view of the structure shown in FIG. 5A after forming second spacers within the area previously occupied by the end segments of each remaining portion of sacrificial semiconductor material and on sidewall surfaces of non-removed portions of each sacrificial semiconductor material of the multilayered stacked semiconductor material structure.
Figure 6B:
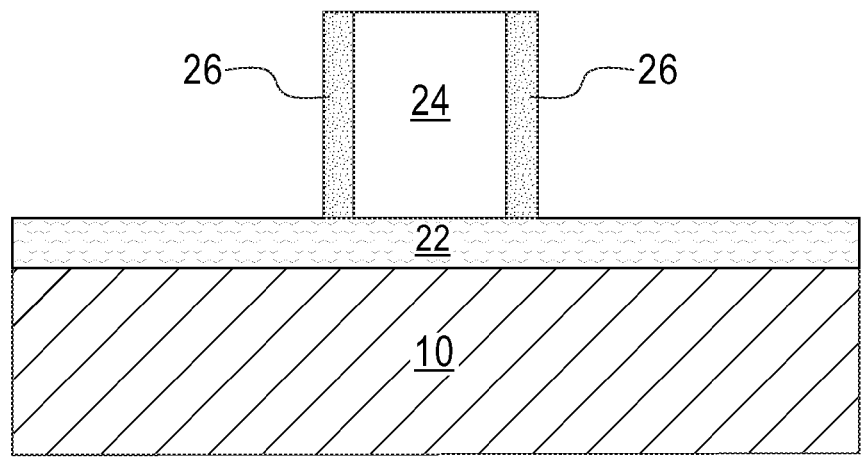
FIG. 6B is a vertical cross sectional through line A-A shown in FIG. 6A.
Figure 6C:
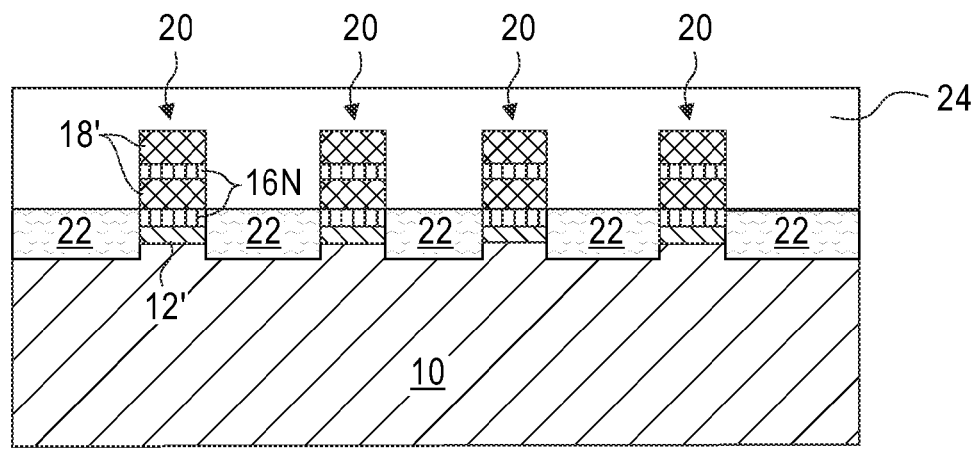
FIG. 6C is a vertical cross sectional view through line B-B shown in FIG. 6A.
Figure 6D:
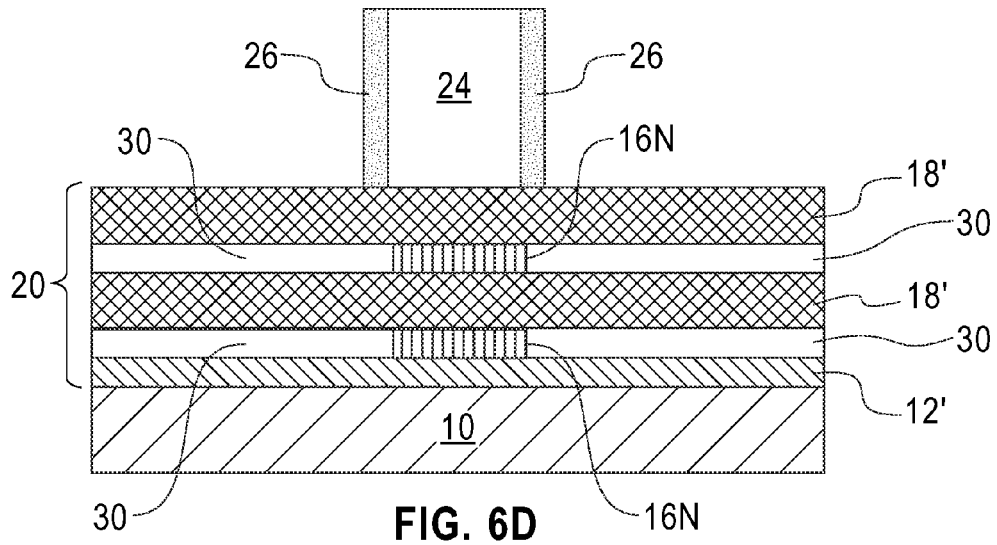
FIG. 6D is a vertical cross sectional view through line C-C shown in FIG. 6A.

The present application, which provides a semiconductor nanowire field effect transistor and a method of forming the same, will now be described in greater detail by referring to the following discussion and drawings that accompany the present application. It is noted that the drawings of the present application are provided for illustrative purposes and, as such, they are not drawn to scale. In the drawings and the description that follows, like elements are referred to by like reference numerals. For purposes of the description hereinafter, the terms "upper", "lower", "right", "left", "vertical", "horizontal", "top", "bottom", and derivatives thereof shall relate to the components, layers and/or elements as oriented in the drawing figures which accompany the present application.

In the following description, numerous specific details are set forth, such as particular structures, components, materials, dimensions, processing steps and techniques, in order to provide a thorough understanding of the present application. However, it will be appreciated by one of ordinary skill in the art that the present application may be practiced with viable alternative process options without these specific details. In other instances, well-known structures or processing steps have not been described in detail in order to avoid obscuring the various embodiments of the present application.

In current semiconductor nanowire device manufacturing, stacked semiconductor nanowires can be used to generate high current for complementary metal oxide semiconductor (CMOS) devices. Current techniques used to form stacked semiconductor nanowires include providing a semiconductor material stack including sequentially formed SiGe release layers and semiconductor material layers. During the formation of the stacked semiconductor nanowires, the various SiGe release layers are removed from the semiconductor material stack forming stacked semiconductor nanowires comprising the semiconductor material layers. Such stacked semiconductor nanowires have a high parasitic capacitance associated therewith. The present application provides a semiconductor structure including stacked semiconductor nanowires in which a dielectric spacer (i.e., tunnel spacer) is located beneath each of the semiconductor nanowires. The presence of a dielectric spacer beneath each of the semiconductor nanowires reduces the parasitic capacitance of the structure.

Reference is now made to FIG. 1 which illustrates an initial structure that can be employed in one embodiment of the present application. The initial structure includes a semiconductor substrate 10 having a base sacrificial semiconductor layer 12 located on a surface of the semiconductor substrate 10. The initial structure further includes a semiconductor material stack 14 located on the base sacrificial semiconductor layer 12. In some embodiments of the present application, the base sacrificial semiconductor layer 12 is omitted and the semiconductor material stack 14 is formed directly on an exposed surface of semiconductor substrate 10.

The semiconductor material stack 14 comprises alternating layers of a sacrificial semiconductor material 16 and a semiconductor nanowire template material 18 that can be employed in one embodiment of the present application. In accordance with the present application, sacrificial semiconductor material 16 comprises a different semiconductor material than the semiconductor nanowire template material 18. Also, the topmost layer of the semiconductor material stack 14 comprises a semiconductor nanowire template material 18. The semiconductor material stack 14 can comprise at least two layers of sacrificial semiconductor material 16 and at least two layers of semiconductor nanowire template material 18, with the proviso that the topmost layer of the semiconductor material stack 14 is a layer of semiconductor nanowire template material 18, and that each layer of semiconductor nanowire template material 18 within the semiconductor material stack 14 is separated by a sacrificial semiconductor material 16. The term "semiconductor nanowire template material" is used throughout the present application to denote a semiconductor material that will be processed into a semiconductor nanowire.

The semiconductor substrate 10 that is employed in the present application can include any semiconductor material. Illustrative examples of semiconductor materials that can be used for the semiconductor substrate 10 include, but are not limited to, Si, SiGe alloys, SiGeC, SiC, Ge alloy, GaSb, GaP, GaN, GaAs, InAs, INP, AlN and all other III-V or II-VI compound semiconductors. In one embodiment, the semiconductor substrate 10 may comprise a multilayered stack of such semiconductor materials.

In some embodiments, the semiconductor substrate 10 may comprise a bulk semiconductor substrate. By "bulk" it is meant the entirety of the semiconductor substrate 10 from one surface to an opposite surface is composed of a semiconductor material. In other embodiments, the semiconductor substrate 10 may comprise a semiconductor-on-insulator substrate including a handle substrate, a buried insulator layer and a top semiconductor material layer. The handle substrate and the top semiconductor material layer may comprise a same or different semiconductor material. In some embodiments, the handle substrate can be comprised of a dielectric material such as, for example, glass or a polymer. The buried insulator layer may be comprised of a dielectric oxide, dielectric nitride and/or dielectric oxynitride. In one example, the buried insulator layer can be composed of silicon oxide.

In one embodiment of the present application, the semiconductor substrate 10 may comprise a single crystalline semiconductor material. In another embodiment of the present application, the semiconductor substrate 10 may comprise a polycrystalline semiconductor material. In yet another embodiment, the semiconductor substrate 10 can comprise an amorphous semiconductor material. The semiconductor substrate 10 can be undoped, doped or contain regions that are undoped and other regions that are doped. In one example, the semiconductor substrate 10 may comprise a single crystalline semiconductor material that is entirely non-doped.

As stated above, the initial structure shown in FIG. 1 includes a base sacrificial semiconductor layer 12 located on a surface of semiconductor substrate 10. The base sacrificial semiconductor layer 12 comprises a different semiconductor material or composition than the semiconductor substrate 10. In one embodiment, the base sacrificial semiconductor layer 12 comprises a silicon germanium alloy material of a first germanium content located on a surface of the semiconductor substrate 10. In some embodiments of the present application, the base sacrificial semiconductor layer 12 has a same crystal orientation as the underlying semiconductor substrate 10. The base sacrificial semiconductor layer 12 is a contiguous (i.e., blanket) layer that is present across the entirety of the semiconductor substrate 10. As stated above and in some embodiments, the base sacrificial semiconductor layer 12 is omitted.

The presence of the base sacrificial semiconductor layer 12 aids in reducing the parasitic capacitance of the stacked semiconductor nanowire field effect transistor of the present application.

In embodiments of the present application in which the base sacrificial semiconductor layer 12 comprises a silicon germanium alloy of a first germanium content, the first germanium content is from 20 atomic % germanium to 80 atomic % germanium, with the remainder up to 100% being silicon. In another embodiment of the present application, the first germanium content is from 40 atomic % germanium to 60 atomic % germanium, with the remainder up to 100% being silicon.

The base sacrificial semiconductor layer 12 can be formed by an epitaxial growth (or deposition) process. The term "epitaxial growth and/or deposition" means the growth of a semiconductor material on a deposition surface of a semiconductor material, in which the semiconductor material being grown has the same (or nearly the same) crystalline characteristics as the semiconductor material of the deposition surface. In accordance with an embodiment of the present application, the base sacrificial semiconductor layer 12 can be epitaxially grown at a temperature from 300° C. to 800° C. using a gas mixture that includes at least one source gas. In one example, the base sacrificial semiconductor layer 12 can be epitaxially grown at a temperature from 400° C. to 600° C. In one embodiment of the present application, the base sacrificial semiconductor layer 12 can be epitaxially grown utilizing plasma enhanced chemical vapor deposition (PECVD). In one example, a PECVD device can employ a parallel plate chamber configuration. In other embodiments, a hot-wire chemical vapor deposition process can be used in forming the base sacrificial semiconductor layer 12.

In one embodiment of the present application, the at least one source gas used to form the base sacrificial semiconductor layer 12 may comprise a Si-containing precursor, such as, for example, a silane or a disilane, and/or a germanium-containing precursor such as, for example, a germane, $GeH_4$.

The base sacrificial semiconductor layer 12 can have a thickness from 5 nm to 25 nm, although other thicknesses that are lesser than or greater than the aforementioned thickness range can also be used as the thickness of the base sacrificial semiconductor layer 12.

In some embodiments of the present application, a dopant can be introduced into the base sacrificial semiconductor layer 12 providing a doped base sacrificial semiconductor layer. In one embodiment, a dopant source gas can be introduced during the epitaxial growth process. Such a process can be referred to as an in-situ epitaxial growth process. In another embodiment, a dopant can be introduced into a previously non-doped base sacrificial semiconductor layer by ion implantation, gas phase doping, or by a cluster beam process.

In one embodiment, a p-type dopant can be present in the base sacrificial semiconductor layer 12. In such an embodiment, the p-type dopant can be an element from Group IIIA of the Periodic Table of Elements, i.e., one of B, Al, and/or In. When a p-type dopant is employed, the content of p-type dopant within the base sacrificial semiconductor layer 12 can be from $10^{19}$ atoms/cm$^3$ to $10^{22}$ atoms/cm$^3$.

In another embodiment, an n-type dopant can be present in the base sacrificial semiconductor layer 12. In such an embodiment, the n-type dopant can be an element from Group VA of the Periodic Table of Elements, i.e., one of P, As, and/or Sb. When an n-type dopant is employed, the content of n-type dopant within the base sacrificial semiconductor layer 12 can be from $10^{19}$ atoms/cm$^3$ to $10^{22}$ atoms/cm$^3$.

Following the formation of the base sacrificial semiconductor layer 12, the semiconductor material stack 14 is formed on an exposed surface of the base sacrificial semiconductor layer 12. In some embodiments of the present application, each layer of the semiconductor material stack 14 has a same crystal orientation as the underlying base sacrificial semiconductor layer 12. In embodiments of the present application in which the base sacrificial semiconductor layer is omitted, each layer of the semiconductor material stack 14 can have a same crystal orientation as the semiconductor substrate 12. The semiconductor material stack 14 is a contiguous (i.e., blanket) layer that is present across the entirety of the base sacrificial semiconductor layer 12, or semiconductor substrate 10.

As mentioned above, the semiconductor material stack 14 includes alternating layers of a sacrificial semiconductor material 16 and a semiconductor nanowire template material 18. In accordance with the present application, the sacrificial semiconductor material 16 comprises a different semiconductor material than the semiconductor nanowire template material 18. As also mentioned above, the topmost layer of the semiconductor material stack 14 includes a semiconductor nanowire template material 18.

Each layer of sacrificial semiconductor material 16 may comprise a same or different semiconductor material selected from Si, SiGe alloys, SiGeC, SiC, Ge alloy, GaSb, GaP, GaN, GaAs, InAs, INP, AlN and all other III-V or II-VI compound semiconductors. Each layer of sacrificial semiconductor material 16 may comprise a same or different, typically the same, semiconductor material as that of the underlying base sacrificial semiconductor layer 12. Each layer of sacrificial semiconductor material 16 comprises a different semiconductor material than the semiconductor substrate 10. In one embodiment, each layer of sacrificial semiconductor material 16 is a silicon germanium alloy having a second germanium content which is different from the first germanium content of a base sacrificial silicon germanium alloy layer. In one embodiment, the second germanium content may be at least half of the first germanium content. In such an embodiment and by way of an example, each layer of sacrificial silicon germanium alloy material within the semiconductor material stack 14 may have a germanium content of from 1 atomic % germanium to 40 atomic % germanium, the reminder up to 100% being silicon. In one embodiment, the individual layers of sacrificial silicon germanium alloy material used as sacrificial semiconductor material 16 may each have a same second germanium content. In another embodiment, the individual layers of sacrificial silicon germanium alloy material used as sacrificial semiconductor material 16 may each have a different second germanium content. In a further embodiment, a first set of layers of sacrificial silicon germanium alloy material used as the sacrificial semiconductor material 16 may have a first value within the second germanium content range mentioned above, while a second set of layers of sacrificial silicon germanium alloy material used as sacrificial semiconductor material 16 may have a second value, that differs from the first value, but is yet within the second germanium content range mentioned above.

Each layer of sacrificial semiconductor material 16 may be formed by an epitaxial growth process such as described above in forming the base sacrificial semiconductor layer 12. In one embodiment, each layer of sacrificial semiconductor material 16 may be non-doped. In another embodiment, each layer of sacrificial semiconductor material 16 may be doped with a p-type or n-type dopant. In another embodiment, a first set of layers of sacrificial semiconductor material 16 can be non-doped, while a second set of layers of sacrificial semiconductor material 16 can be doped. When doped, the dopant can be an n- or p-type dopant as described above in connection with the base sacrificial semiconductor layer 12. When doped, one of the doping techniques mentioned above can be used in forming a doped layer of sacrificial semiconductor material 16. When doped, the dopant concentration can be in the range mentioned above for the base sacrificial semiconductor layer 12.

Each layer of sacrificial semiconductor material 16 can have a thickness from 5 nm to 25 nm, although other thicknesses that are lesser than or greater than the aforementioned thickness range can also be used as the thickness of each layer of sacrificial semiconductor material 16. In one embodiment, each layer of sacrificial semiconductor material 16 may have a same thickness. In another embodiment, each layer of sacrificial semiconductor material 16 may have a different thickness. In a further embodiment, a first set of layers of sacrificial semiconductor material 16 may have a first thickness, while a second set of layers of sacrificial semiconductor material 16 may have a second thickness that differs from the first thickness.

Each layer of semiconductor nanowire template material 18 within the semiconductor material stack 14 may comprise a semiconductor material that differs from the semiconductor material present in each layer of sacrificial semiconductor material 16 and the base sacrificial semiconductor layer 12. Thus, each layer of semiconductor nanowire template material 18 within the semiconductor material stack 14 may comprise Si, SiGe, SiGeC, SiC, Ge alloy, GaSb, GaP, GaN, GaAs, InAs, INP, AlN and all other III-V or II-VI compound semiconductors. In one embodiment, each layer of semiconductor nanowire template material 18 within the semiconductor material stack 14 may comprise a same semiconductor material. In yet another embodiment, each layer of semiconductor nanowire template material 18 within the semiconductor material stack 14 may comprise a different semiconductor material. In yet a further embodiment, a first set of layers of semiconductor nanowire template material 18 within semiconductor material stack 14 comprises a first semiconductor material, while a second set of layers of semiconductor nanowire template material 18 within the semiconductor material stack 14 comprises a second semiconductor material which differs from the first semiconductor material. In one embodiment of the present application and when each sacrificial semiconductor material 16 comprises a silicon germanium alloy material, each layer of semiconductor nanowire template material 18 within semiconductor material stack 14 comprises crystalline silicon. Each semiconductor nanowire template material 18 within the semiconductor material stack 14 is typically, but not necessarily, non-doped. A dopant, i.e., n-type dopant or p-type dopant, can be introduced using an in-situ epitaxial deposition process, or by first forming a non-doped layer of semiconductor material and thereafter introducing the dopant into the non-doped layer of semiconductor material by ion implantation, gas phase doping, or a cluster beam process.

Each layer of semiconductor nanowire template material 18 within the semiconductor material stack 14 may be formed by an epitaxial growth (or deposition process). In an embodiment of the present application, each layer of semiconductor nanowire template material 18 can be epitaxially grown at a temperature from 300° C. to 800° C. using a gas mixture that includes at least one semiconductor source gas. In one example, each layer of semiconductor nanowire template material 18 can be epitaxially grown at a temperature from 400° C. to 600° C. In one embodiment of the present application, each layer of semiconductor nanowire template material 18 can be epitaxially grown utilizing plasma enhanced chemical vapor deposition (PECVD). In one example, a PECVD device can employ a parallel plate chamber configuration. In other embodiments, a hot-wire chemical vapor deposition process can be used in forming each layer of semiconductor nanowire template material 18.

In some embodiments of the present application, the epitaxial growth of the various layers of sacrificial semiconductor material 16 and semiconductor nanowire template material 18 may be performed without breaking vacuum between the various depositions. Similarly, the epitaxial growth of the base sacrificial semiconductor layer 12 and the various layers of the semiconductor material stack 14 can be performed without breaking vacuum between the various depositions. In another embodiment of the present application, the vacuum may be broken between any of the various depositions.

In one embodiment of the present application, the at least one semiconductor source gas used to form the semiconductor nanowire template material 18 may comprise a Si-containing precursor, such as, for example, a silane or a disilane, and/or a germanium-containing precursor such as, for example, a germane, $GeH_4$.

Each layer of semiconductor nanowire template material 18 can have a thickness from 5 nm to 25 nm, although other thicknesses that are lesser than or greater than the aforementioned thickness range can also be used as the thickness of each layer of semiconductor nanowire template material 18. In one embodiment, each layer of semiconductor nanowire template material 18 may have a same thickness. In another embodiment, each layer of semiconductor nanowire template material 18 may have a different thickness. In a further embodiment, a first set of layers of semiconductor nanowire template material 18 may have a first thickness, while a second set of layers of semiconductor nanowire template material 18 may have a second thickness that differs from the first thickness.

In one embodiment of the present application, semiconductor substrate 10 comprises single crystalline silicon, the base sacrificial semiconductor layer 12 comprises a silicon germanium alloy having a first germanium content, as defined above, each sacrificial material 16 within the semiconductor material stack 14 comprises a silicon germanium alloy material having a second germanium content, as defined above, and each semiconductor nanowire template material 18 of the semiconductor material stack 14 comprises silicon. In one embodiment, each of semiconductor substrate 10, base sacrificial semiconductor layer 12, sacrificial semiconductor material 16, and the semiconductor nanowire template material 18 have a same crystal orientation.

Referring now to FIGS. 2A-D, there are illustrated various views of the structure shown in FIG. 1 after formation of at least one multilayered stacked semiconductor material structure 20 on a mesa surface 10m of the semiconductor substrate 10 and formation of trench isolation structures 22 on recessed surfaces 10r of the semiconductor substrate 10 which are located adjacent the mesa surface 10m. The at least one multilayered stacked semiconductor material structure 20 includes a remaining portion of the base sacrificial semiconductor layer 12', and remaining portions of the alternating layers of the sacrificial semiconductor material 16' and the semiconductor nanowire template material 18'.

As is shown, a topmost surface of each trench isolation structure 22 that is formed may extend above the topmost surface of the semiconductor substrate 10. In one embodiment, the topmost surface of each trench isolation structure 22 that is formed may extend above an upper surface of the remaining portion of the base sacrificial semiconductor layer 12'. In yet another embodiment, the topmost surface of each trench isolation structure 22 that is formed may be coplanar with an upper surface of the bottommost remaining portion of each sacrificial semiconductor material 16' of each multilayered stacked semiconductor material structure 20.

As is also shown, the remaining portion of the base sacrificial semiconductor layer 12', and remaining portions of alternating layers of the sacrificial semiconductor material 16' and the semiconductor nanowire template material 18' which form each multilayered stacked semiconductor material structure 20 have sidewall surfaces that are vertically coincident with each other.

The structure shown in FIGS. 2A-2D is formed by first providing a trench pattern through the semiconductor material stack 14, through the base sacrificial semiconductor layer 12 and into portions of the semiconductor substrate 10. The trench pattern can be formed by lithography and etching. Lithography can include forming a photoresist (not shown) on an exposed surface of the semiconductor material stack 14, exposing the photoresist to a desired pattern of radiation, and then developing the exposed photoresist with a conventional resist developer to provide a patterned photoresist atop the semiconductor material. At least one etch is then employed which transfers the pattern from the patterned photoresist through the semiconductor material stack 14, through the base sacrificial semiconductor layer 12 and into portions of the semiconductor substrate 10. In one embodiment, the etch used for pattern transfer may include a dry etch process such as, for example, reactive ion etching, plasma etching, ion beam etching and laser ablation. In another embodiment, the etch used for pattern transfer may include a wet chemical etchant such as, for example, KOH (potassium hydroxide). In yet another embodiment, a combination of a dry etch and a wet chemical etch may be used to transfer the pattern. After transferring the pattern through the semiconductor material stack 14, through the base sacrificial semiconductor layer 12 and into portions of the semiconductor substrate 10, the patterned photoresist can be removed utilizing a conventional resist stripping process such as, for example, ashing.

In some embodiments, a hard mask such as, for example, a dielectric oxide can be formed by, for example, a deposition process, atop the surface of the semiconductor material stack 14 prior to application of the photoresist. In such an embodiment, the pattern from the patterned photoresist is first transferred into the hard mask and then into the underlying material layers. The patterned photoresist can be removed anytime after the hard mask has been patterned. Remaining portions of the hard mask may remain atop each multilayered stacked semiconductor material structure 20, and can be removed during the formation of the trench isolation structures 22.

The remaining portions of the semiconductor material stack and the remaining portion of base sacrificial semiconductor layer 12' collectively define the least one multilayered stacked semiconductor material structure 20.

After pattern transfer through the semiconductor material stack 14, through the base sacrificial semiconductor layer 12 and into portions of the semiconductor substrate 10, trenches are provided into the semiconductor substrate 10. Each trench can have a recessed surface 10r as compared to non-recessed surfaces of the semiconductor substrate 10. The non-recessed surfaces of the semiconductor substrate 10 can be referred to herein as mesa surfaces 10m. Atop each mesa surface 10m is present a multilayered stacked semiconductor material structure 20.

Each trench is then filled with a trench dielectric material such as an oxide forming the trench isolation structures 22. In one embodiment, the trench fill can be performed utilizing a high-density plasma oxide deposition process. In another embodiment, the trench fill can be performed by deposition of tetrethylorothosilicate. In some embodiments, and when a remaining portion of the hard mask is present atop each of the multilayered stacked semiconductor material structures 20, the remaining portion of each hard mask can be removed from atop the multilayered stacked semiconductor material structures 20 by a planarization process such as, for example, chemical mechanical polishing.

When a plurality of multilayered stacked semiconductor material structures 20 are formed, each multilayered stacked semiconductor material structure 20 is oriented parallel to one another. In one embodiment, the distance between neighboring multilayered stacked semiconductor material structures 20 can be from 10 nm to 200 nm. In another embodiment, the distance between neighboring multilayered stacked semiconductor material structures 20 can be from 25 nm to 50 nm. In one embodiment, each multilayered stacked semiconductor material structure 20 that is formed has a width from 4 nm to 20 nm, and a length from 0.1 μm to 10 μm. In another embodiment, each multilayered stacked semiconductor material structure 20 that is formed has a width from 5 nm to 7 nm, and a length from 1 μm to 2 μm.

Referring now FIGS. 3A-3D, there are illustrated the structure shown in FIGS. 2A-2D after forming at least one sacrificial gate material structure 24 on exposed portions of each trench isolation structure 22 and straddling each multilayered stacked semiconductor material structure 20. As shown, each sacrificial gate material structure 24 is oriented in a direction that is perpendicular to each multilayered stacked semiconductor material structure 20.

The at least one sacrificial gate material structure 24 is formed by first providing a blanket layer of a sacrificial gate material on the exposed surfaces of the structure shown in FIGS. 2A-2D. The blanket layer of sacrificial gate material can be formed, for example, by chemical vapor deposition or plasma enhanced chemical vapor deposition. The thickness of the blanket layer of sacrificial gate material can be from 50 nm to 300 nm, although lesser and greater thicknesses can also be employed. The blanket layer of sacrificial gate material can include any material that can be selectively removed from the structure during a subsequently performed etching process. In one embodiment, the blanket layer of sacrificial gate material may be composed of polysilicon. In another embodiment of the present application, the blanket layer of sacrificial gate material may be composed of a metal such as, for example, Al, W, or Cu.

After providing the blanket layer of sacrificial gate material, the blanket layer of sacrificial gate material can be patterned by lithography and etching so as to form the at least one sacrificial gate material structure 24. Lithography can include forming a photoresist (not shown) on an exposed surface of the blanket layer of sacrificial gate material, exposing the photoresist to a desired pattern of radiation, and then developing the exposed photoresist with a conventional resist developer to provide a patterned photoresist atop the blanket layer of sacrificial gate material. An etch is then employed which transfers the pattern from the patterned photoresist into the underlying blanket layer of sacrificial gate material. In one embodiment, the etch used to transfer the pattern from the patterned photoresist into the underlying blanket layer of sacrificial gate material may include a dry etch process such as, for example, reactive ion etching, plasma etching, ion beam etching and laser ablation. In another embodiment, the etch used to transfer the pattern from the patterned photoresist into the underlying blanket layer of sacrificial gate material may include a wet chemical etchant such as, for example, KOH. In yet another embodiment, a combination of a dry etch and a wet chemical etch may be used to transfer the pattern from the patterned photoresist into the underlying blanket layer of sacrificial gate material. After transferring the pattern into the underlying layer of sacrificial gate material, the patterned photoresist can be removed utilizing a conventional resist stripping process such as, for example, ashing.

When a plurality of sacrificial gate material structures 24 are formed, each sacrificial gate material structures 24 is oriented parallel to one another. In one embodiment, the distance between neighboring sacrificial gate material structures 24 can be from 10 nm to 200 nm. In another embodiment, the distance between neighboring sacrificial gate material structures 24 can be from 25 nm to 50 nm. In one embodiment, each sacrificial gate material structure 24 that is formed has a width from 10 nm to 100 nm, and a length from 50 nm to 20,000 nm. In another embodiment, each sacrificial gate material structure 24 that is formed has a width from 15 nm to 20 nm, and a length from 500 nm to 1000 nm.

Referring now to FIGS. 4A-4D, there are illustrated the structure shown in FIGS. 3A-3D after forming a first spacer 26 on exposed sidewall surfaces of each sacrificial gate material structure 24. The first spacer 26 can be formed by first providing a first spacer material and then etching the first spacer material. The first spacer material may be composed of any dielectric spacer material including, for example, a dielectric oxide, dielectric nitride, and/or dielectric oxynitride. In one example, the first spacer material 26 may be composed of silicon oxide or silicon nitride. The first spacer material can be provided by a deposition process including, for example, chemical vapor deposition (CVD), plasma enhanced chemical vapor deposition (PECVD), or physical vapor deposition (PVD). The etching of the first spacer material may comprise a dry etch process such as, for example, a reactive ion etch. As shown, each first spacer 26 has a bottom surface that is present on portions of the trench isolation structures 22 and each first spacer 26 straddles portions of each multilayered stacked semiconductor material structure 20.

Referring now to FIGS. 5A-5D, there are shown the structure of FIGS. 4A-4D after removing end segments of each remaining portion of sacrificial semiconductor material 16' from each multilayered stacked semiconductor material structure 20. As shown, some portions of each remaining portions of sacrificial semiconductor material 16' are not removed.

The non-removed portions of each sacrificial semiconductor material of the multilayered stacked semiconductor material structure are labeled as element 16N in the drawings of the present application.

The removal of end segments of each remaining portion of sacrificial semiconductor material 16' from each multilayered stacked semiconductor material structure 20 can be performed by etching selective to semiconductor nanowire template material 18'. In one embodiment of the present application, the removal of end segments of each remaining portion of sacrificial semiconductor material 16' from each multilayered stacked semiconductor material structure 20 can be performed by etching in HCl vapor and at a temperature from 400° C. to 800° C. In another embodiment of the present application, the removal of end segments of each remaining portion of sacrificial semiconductor material 16' from each multilayered stacked semiconductor material structure 20 can be performed by wet etching using hydrogen peroxide ($H_2O_2$) or isotropic reactive ion etching (RIE).

The amount of end segments of each remaining portion of sacrificial semiconductor material 16' that is removed from each multilayered stacked semiconductor material structure 20 can vary depending on the conditions of the etch employed. In one embodiment, and by way of an example, from 2 nm to 5 nm portions of sacrificial semiconductor material can be removed during this step of the present application.

As shown, the non-removed portions of each sacrificial semiconductor material 16N of the multilayered stacked semiconductor material structure 20 have sidewall surfaces that are vertically offset and recessed as compared to the sidewall surfaces of each remaining portion of semiconductor nanowire template material 18'.

Referring now to FIGS. 6A-6D, there are illustrated the structure shown in FIGS. 5A-5D after forming second spacers 30 within the area previously occupied by the end segments of each remaining portion of sacrificial semiconductor material and on sidewall surfaces of non-removed portions of each sacrificial semiconductor material 16N of each multilayered stacked semiconductor material structure 20.

The second spacers 30 are formed by providing a second spacer material within the area previously occupied by the end segments of each remaining portion of sacrificial semiconductor material and on sidewall surfaces of non-removed portions of each sacrificial semiconductor material 16N of each multilayered stacked semiconductor material structure 20. The second spacer material may comprise a same or different spacer material as the first spacer material. In one example, the second spacer material may comprise a dielectric oxide or dielectric nitride. The second spacer material can be provided by utilizing one of the deposition processes mentioned above in forming the spacer material that provides the first spacer 26. Following the formation of the second spacer material, an etch can be performed that converts the second spacer material into second spacers 30.

Figure 7A:
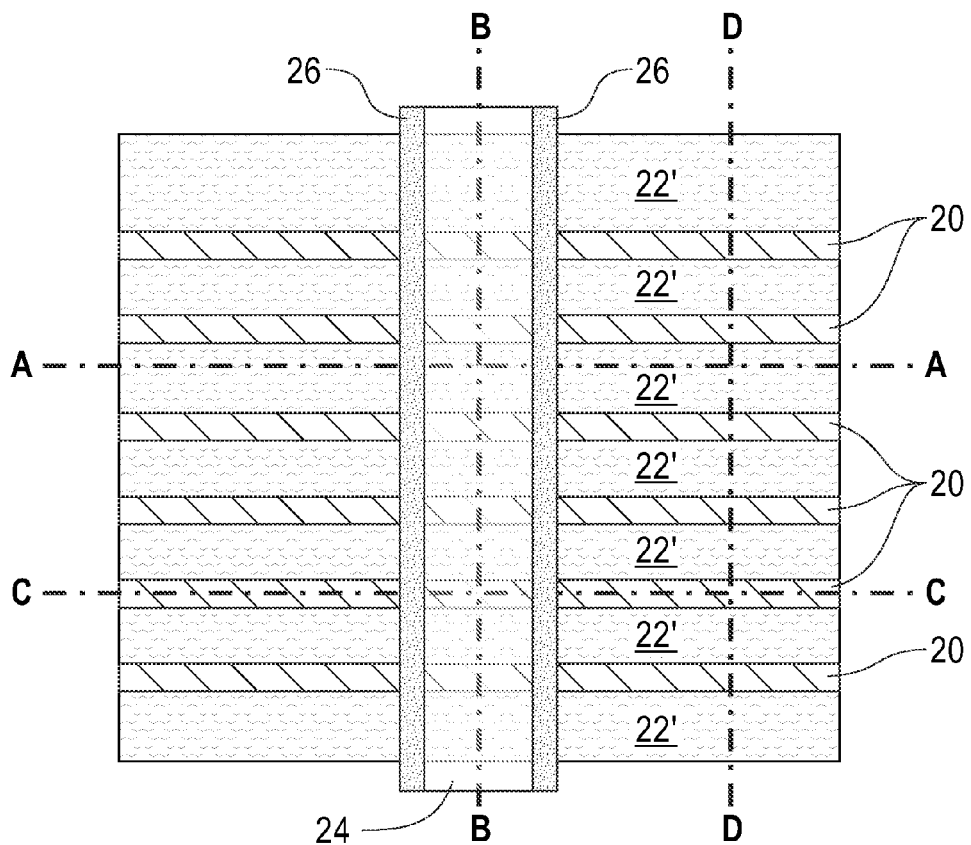
FIG. 7A is a top-down view of the structure shown in FIG. 6A after recessing the trench isolation structures below a bottommost surface of the remaining portion of the base sacrificial semiconductor layer of each multilayered stacked semiconductor material structure.
Figure 7B:
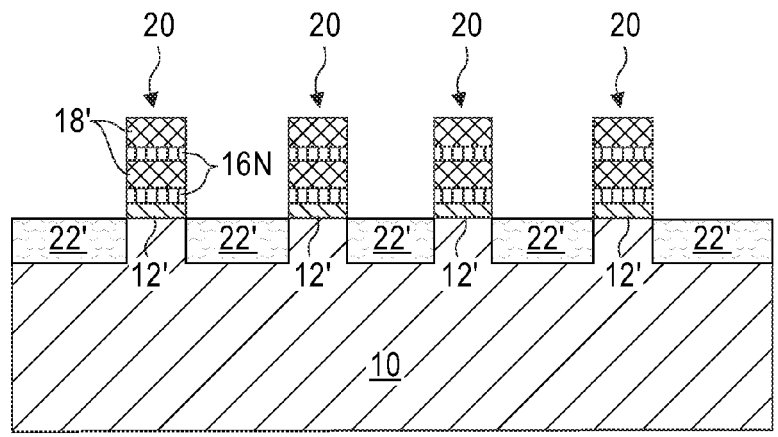
FIG. 7B is a vertical cross sectional through line D-D shown in FIG. 7A.
Figure 8A:
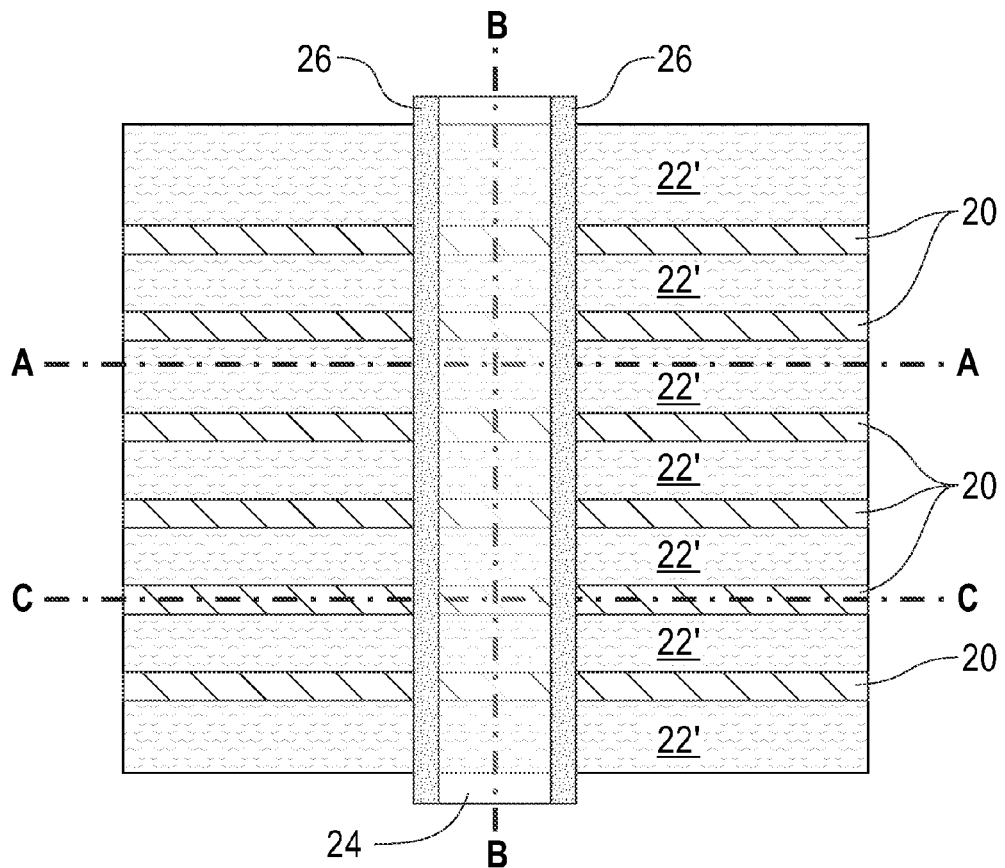
FIG. 8A is a top-down view of the structure shown in FIG. 7A after removing the entirety of the remaining portion of each base sacrificial semiconductor layer from the multilayered stacked semiconductor material structure.
Figure 8B:
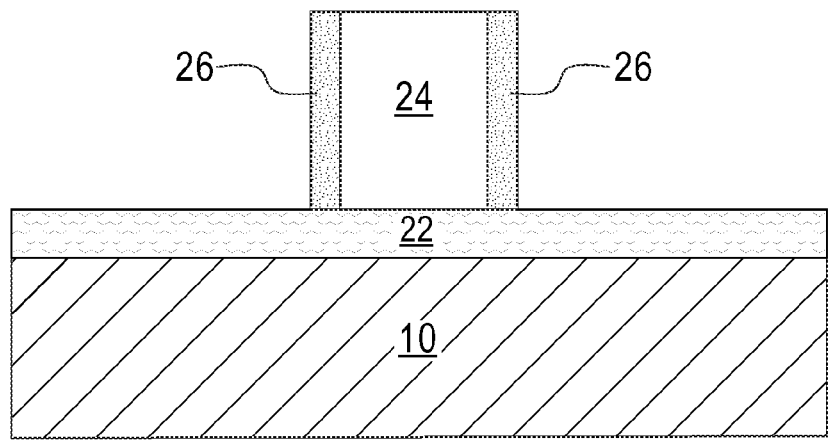
FIG. 8B is a vertical cross sectional through line A-A shown in FIG. 8A.
Figure 8C:
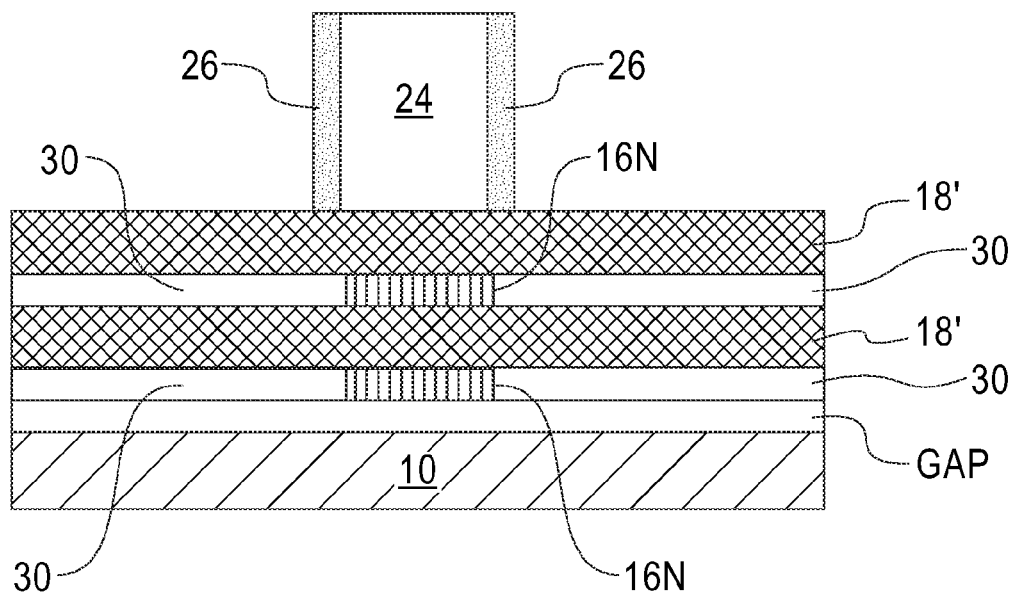
FIG. 8C is a vertical cross sectional view through line B-B shown in FIG. 8A.
Figure 8D:
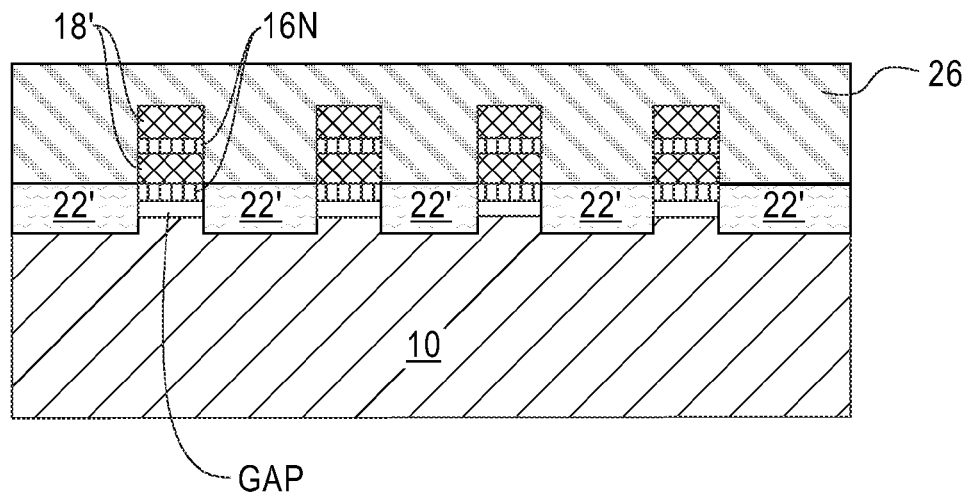
FIG. 8D is a vertical cross sectional view through line C-C shown in FIG. 8A.
Figure 8E:
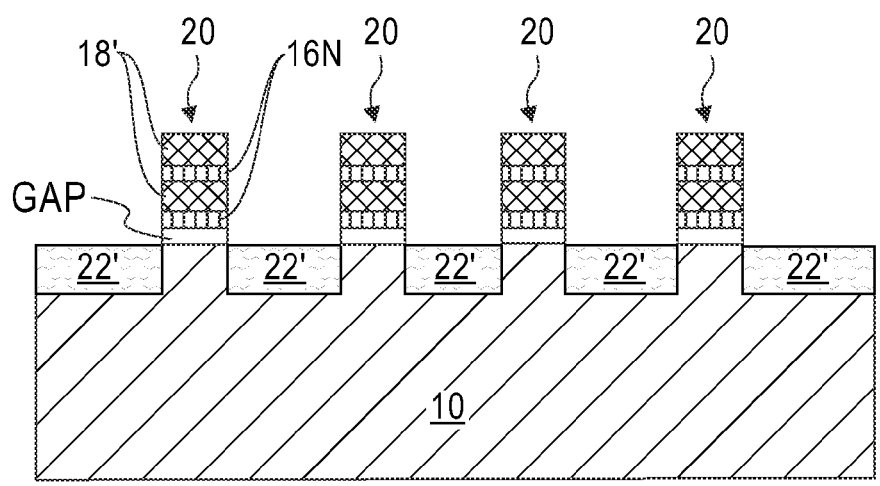
FIG. 8E is a vertical cross sectional view through line D-D shown in FIG. 8A.

Referring now to FIGS. 7A-7B, there are shown the structure of FIGS. 6A-6D after recessing exposed portions of the trench isolation structures 22 below a bottommost surface of the remaining portion of the base sacrificial semiconductor layer 12' of each multilayered stacked semiconductor material structure 20. In some embodiments, the recessing step provides recessed trench isolation structures 22' having an upper surface that is coplanar with the mesa surfaces 10m of the semiconductor substrate 10. The recessing of the trench isolation structures 22 can be performed using a wet etch process such as, for example, HF. In some embodiments of the present application in which the base sacrificial semiconductor layer 12 is not employed, this step of the present application can be omitted.

Referring now to FIGS. 8A-8E, there are shown the structure of FIGS. 7A-7B after removing the entirety of each remaining portion of base sacrificial semiconductor layer 12' from each multilayered stacked semiconductor material structure 20. The removal of the entirety of each remaining portion of base sacrificial semiconductor layer 12' from each multilayered stacked semiconductor material structure 20 can be performed utilizing an etch process. In one embodiment of the present application, an etch selective to non-removed semiconductor material 16N and semiconductor nanowire template material 18' can be used to remove the entirety of each remaining portion of base sacrificial semiconductor layer 12' from each multilayered stacked semiconductor material structure 20. In one example, the selective etch can include an HCl vapor.

The removal of the entirety of each remaining portion of base sacrificial semiconductor layer 12' from each multilayered stacked semiconductor material structure 20 suspends each multilayered stacked semiconductor material structure 20 over the mesa surface 10m of the semiconductor structure 10. Thus, and in some embodiments of the present application, the bottommost surface of each multilayered stacked semiconductor material structure 20 is now exposed. In another embodiment, the bottommost surface of each multilayered stacked semiconductor material structure 20 remains in direct contact with the semiconductor substrate 10.

Figure 9A:
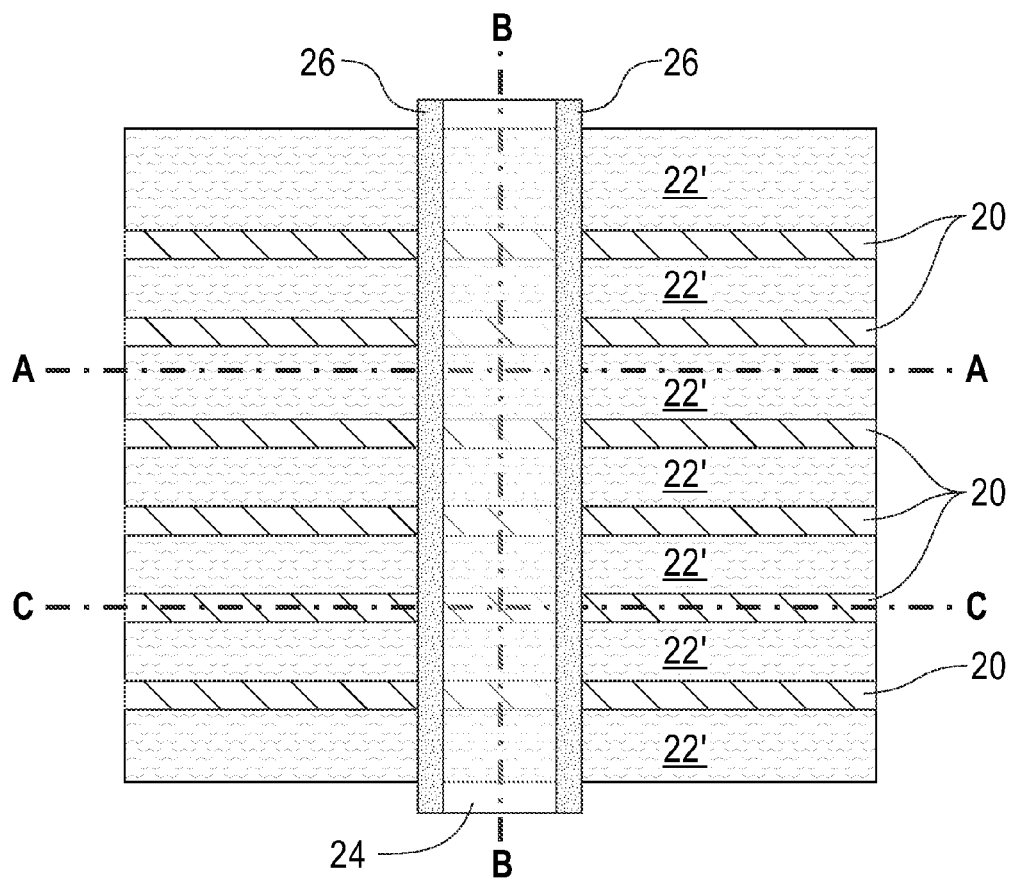
FIG. 9A is a top-down view of the structure shown in FIG. 8A after forming an oxide and planarizing the oxide.
Figure 9B:
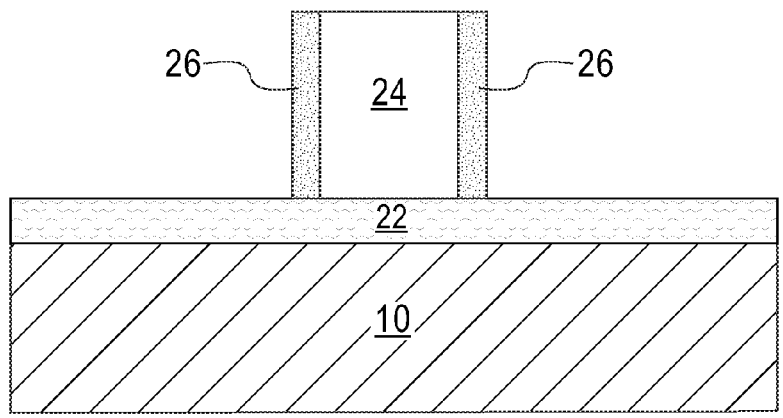
FIG. 9B is a vertical cross sectional through line A-A shown in FIG. 9A.
Figure 9C:
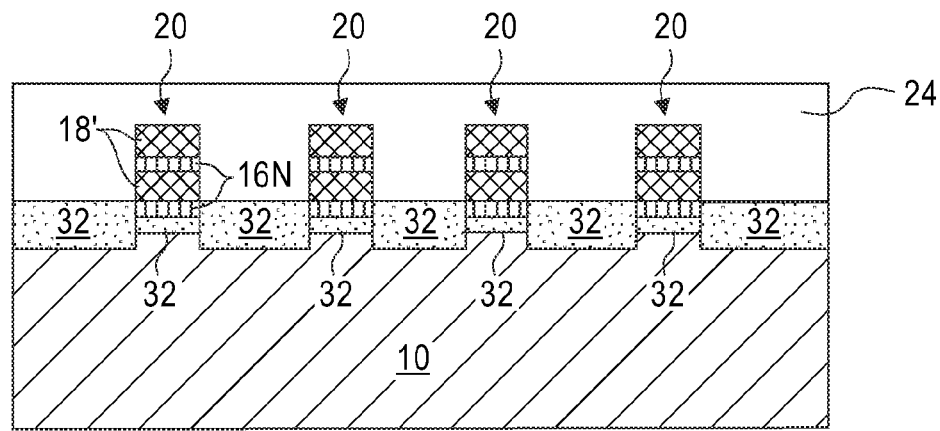
FIG. 9C is a vertical cross sectional view through line B-B shown in FIG. 9A.
Figure 9D:
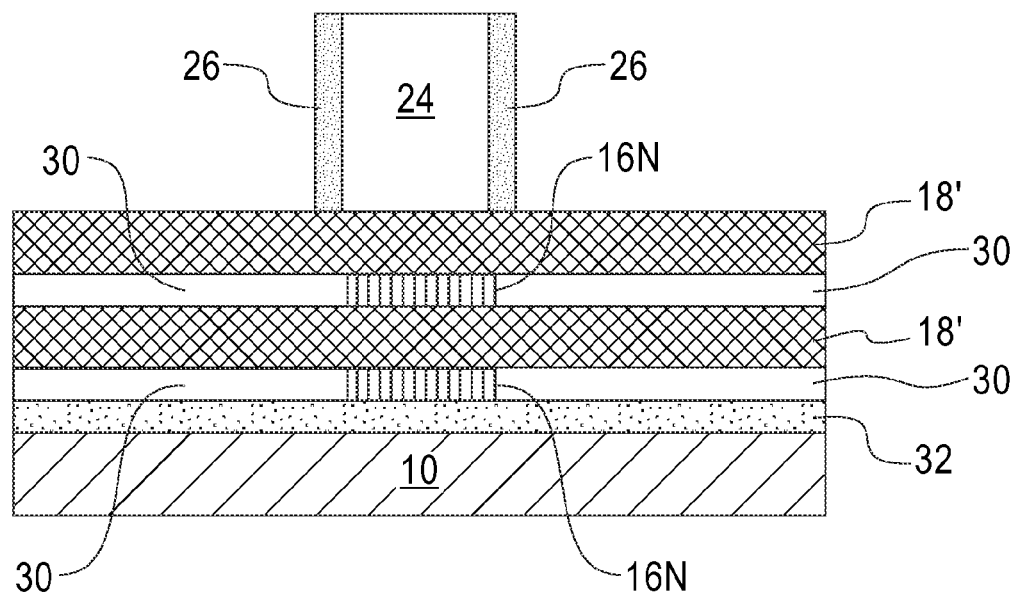
FIG. 9D is a vertical cross sectional view through line C-C shown in FIG. 9A.
Figure 10A:
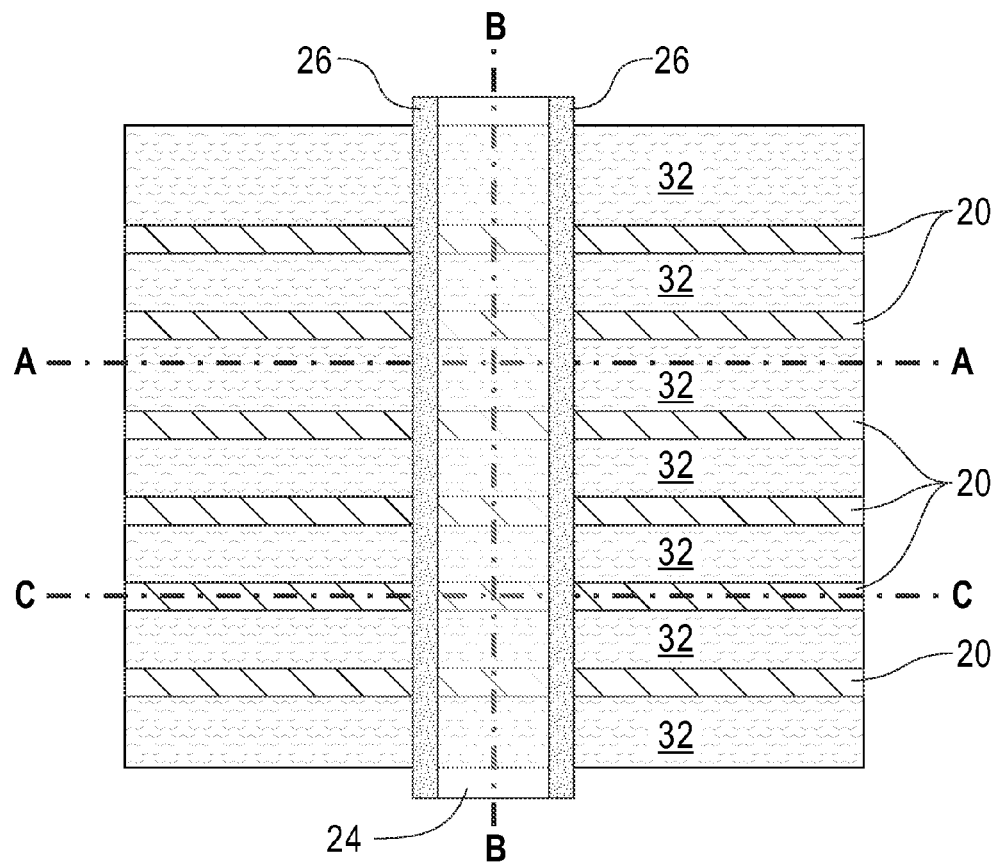
FIG. 10A is a top-down view of the structure shown in FIG. 9A after forming a source region on one side of each sacrificial gate material structure and forming a drain region on the other side of the each sacrificial gate material structure.
Figure 10B:
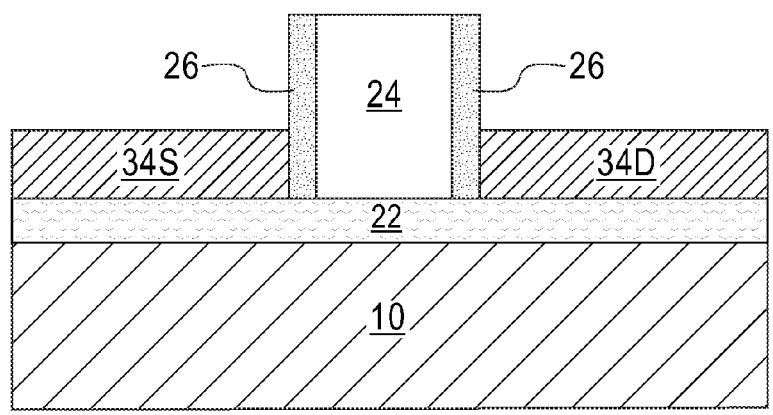
FIG. 10B is a vertical cross sectional through line A-A shown in FIG. 10A.
Figure 10C:
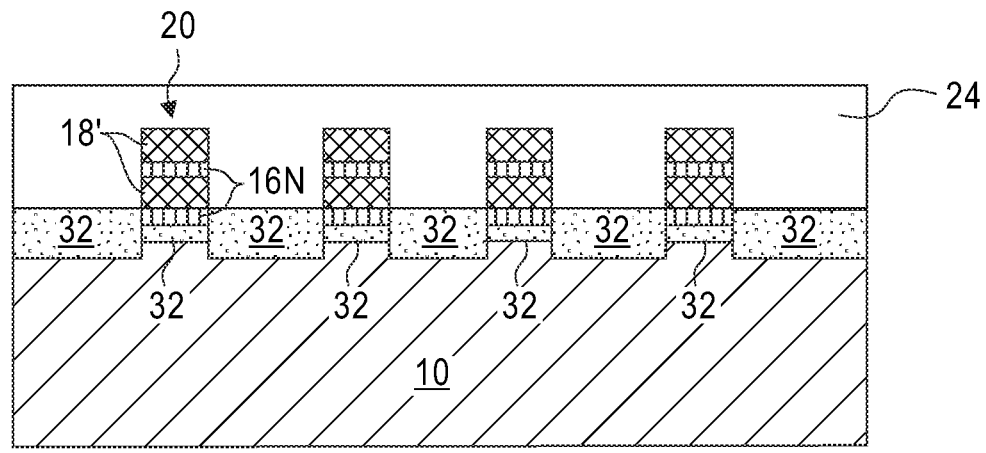
FIG. 10C is a vertical cross sectional view through line B-B shown in FIG. 10A.
Figure 10D:
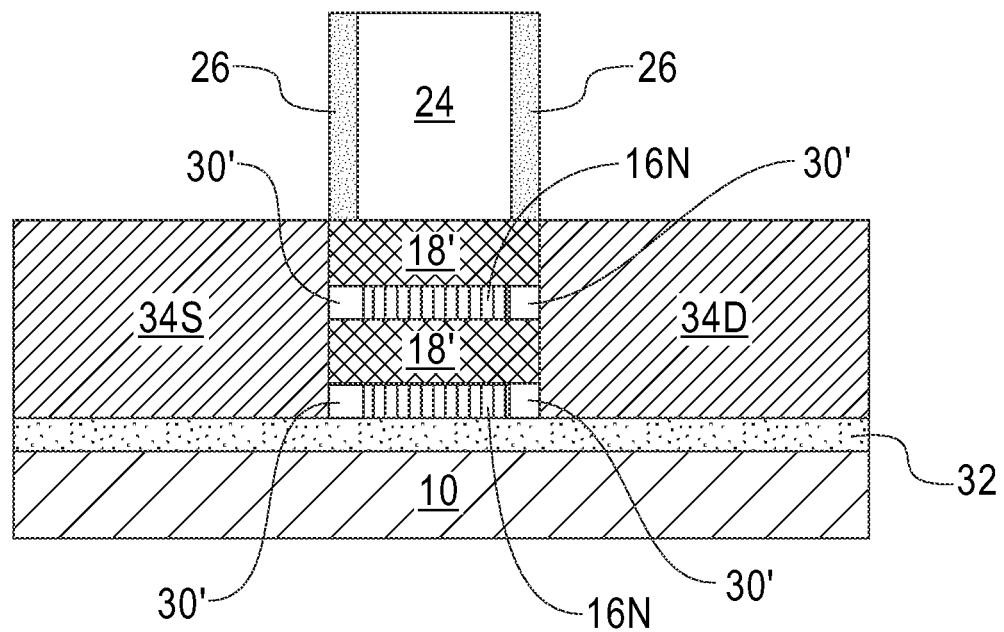
FIG. 10D is a vertical cross sectional view through line C-C shown in FIG. 10A.
Figure 11A:
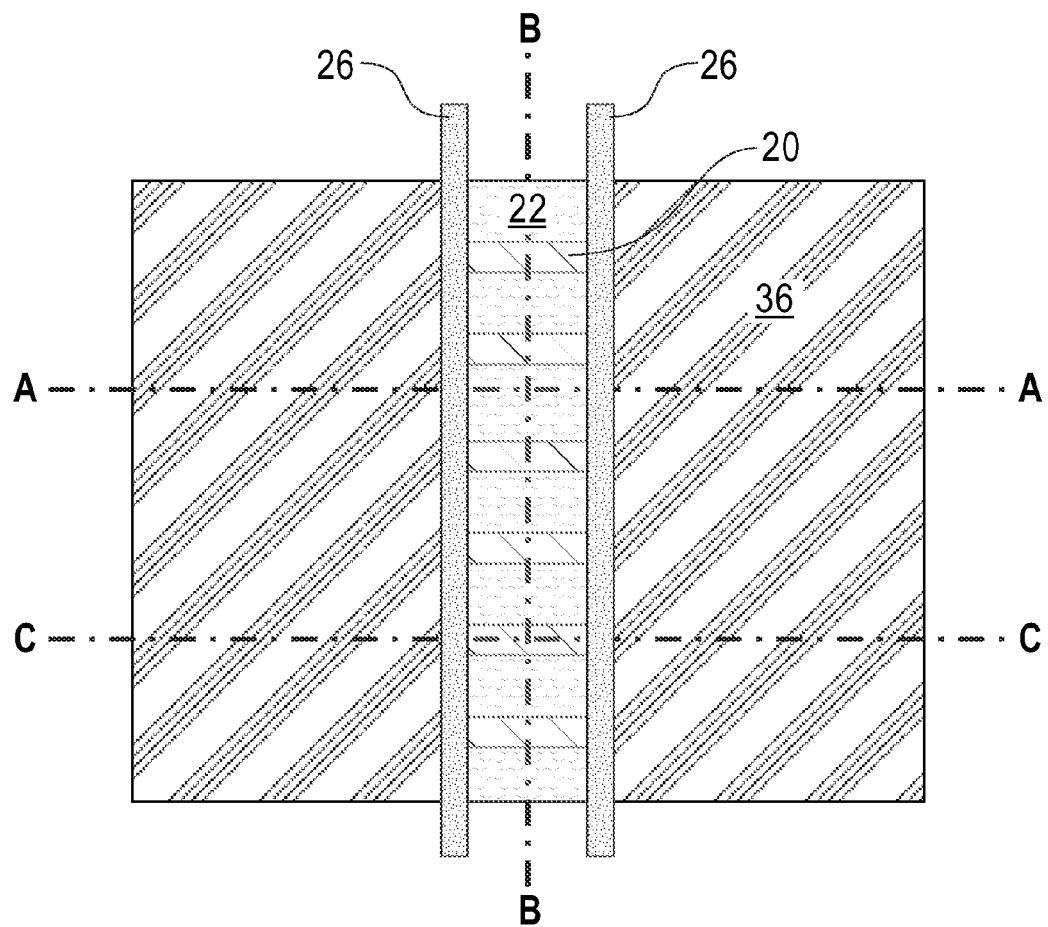
FIG. 11A is a top-down view of the structure shown in FIG. 10A after forming a planarized dielectric material atop the source region and atop the drain region, providing a gate cavity by removing each sacrificial gate material structure to expose a topmost layer of the semiconductor nanowire template material of the multilayered stacked semiconductor material structure, and removing the previously non-removed portions of each sacrificial semiconductor material of the multilayered stacked semiconductor material structure.
Figure 11B:
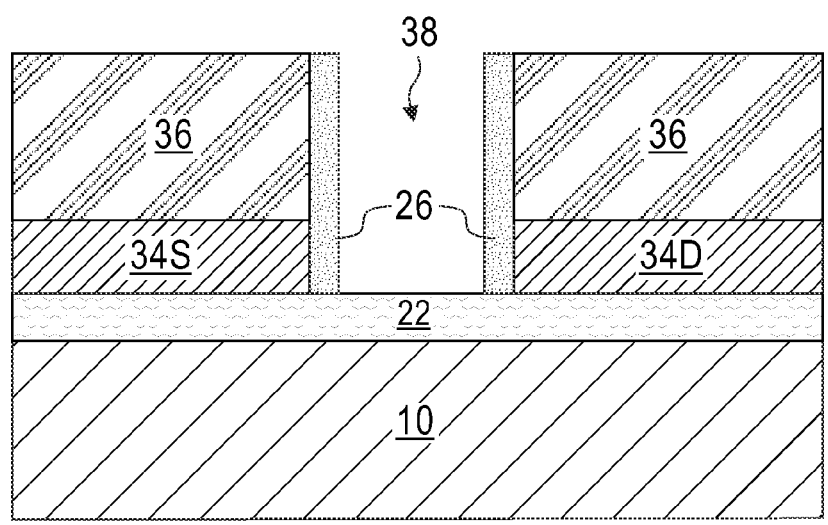
FIG. 11B is a vertical cross sectional through line A-A shown in FIG. 11A.
Figure 11C:
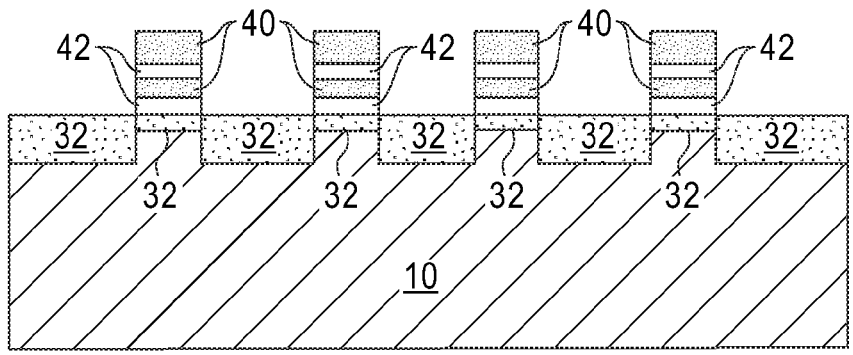
FIG. 11C is a vertical cross sectional view through line B-B shown in FIG. 11A.
Figure 11D:
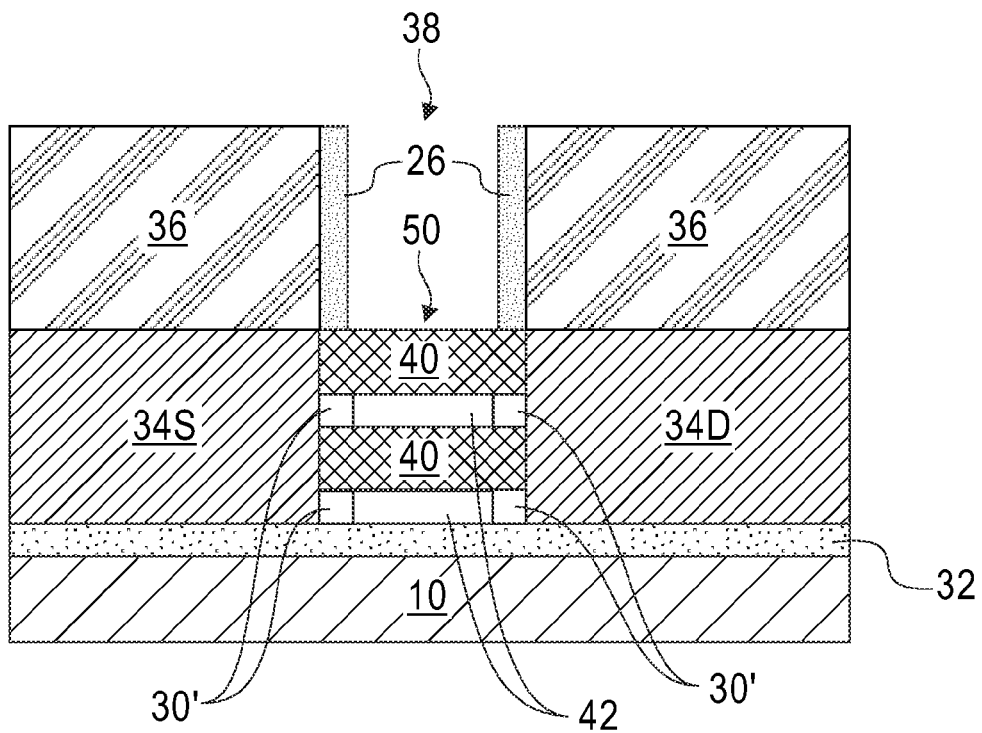
FIG. 11D is a vertical cross sectional view through line C-C shown in FIG. 11A.
Figure 12A:
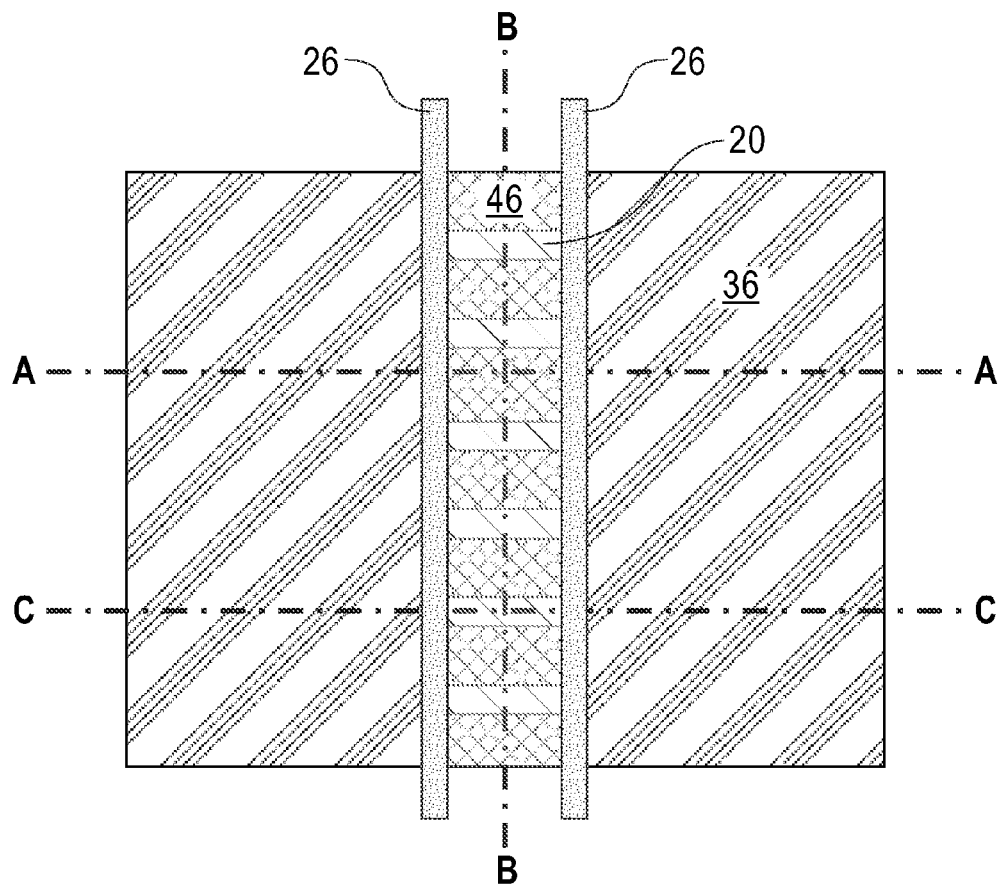
FIG. 12A is a top-down view of the structure shown in FIG. 11A after forming a gate dielectric and a gate conductor within each gate cavity and areas previously occupied by the non-removed portions of each sacrificial semiconductor material.
Figure 12B:
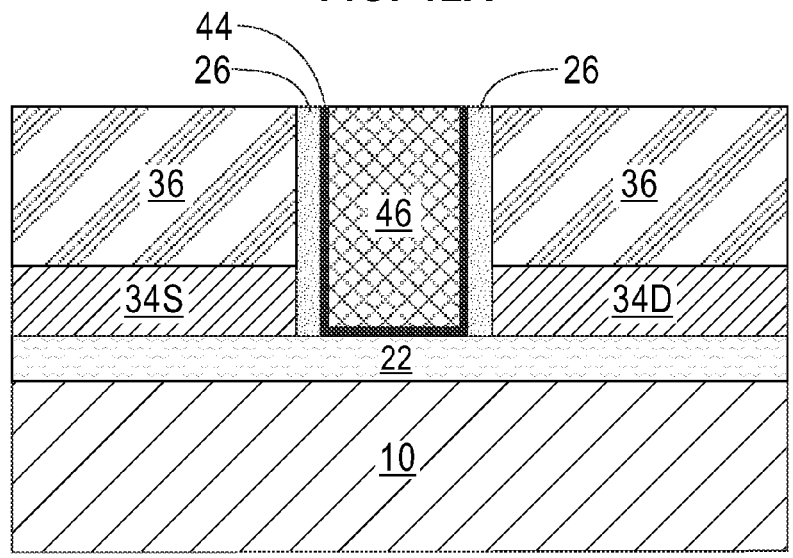
FIG. 12B is a vertical cross sectional through line A-A shown in FIG. 11A.
Figure 12C:
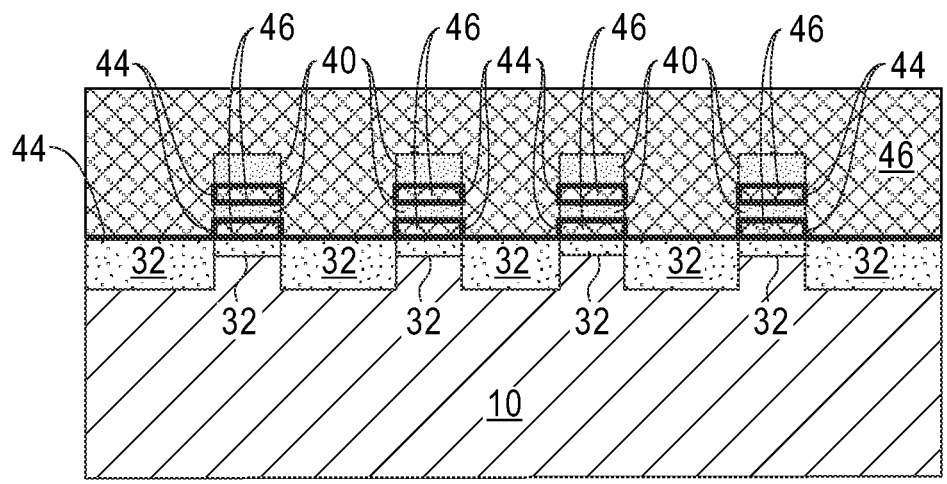
FIG. 12C is a vertical cross sectional view through line B-B shown in FIG. 12A.
Figure 12D:
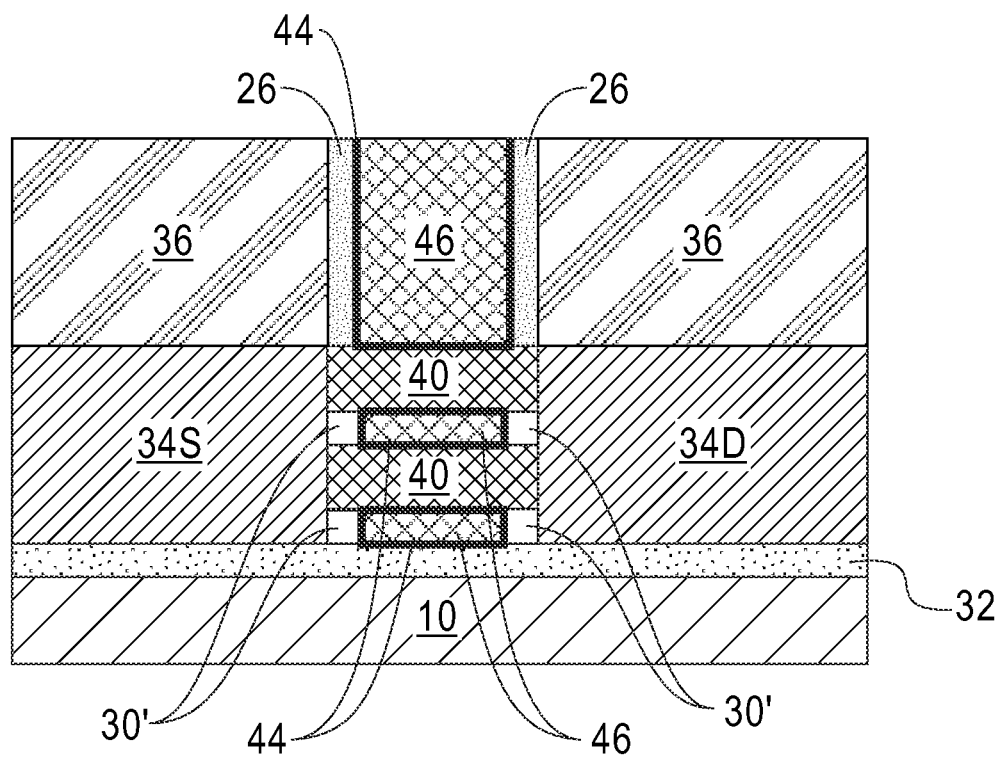
FIG. 12D is a vertical cross sectional view through line C-C shown in FIG. 12A.

Referring now to FIGS. 9A-9D, there are shown the structure of FIGS. 8A-8E after forming an oxide and planarizing the oxide. The planarized oxide is present on exposed portions of each recessed trench isolation structure and it also fills any gap that was created in the previous step of the present application in which the entirety of each remaining portion of base sacrificial semiconductor layer 12' was removed from each multilayered stacked semiconductor material structure 20. The planarized oxide and the recessed trench structures 22' taken together form feature-containing trench isolation structures 32 within the structure. As can be seen in FIG. 9D, the upper surface of the feature-containing trench isolation structure 32 extends above the mesa surface 10m of the semiconductor substrate 10. In one embodiment, the upper surface of the feature-containing trench isolation structure 32 can be coplanar with an upper surface of the bottommost non-removed portion of sacrificial semiconductor material 16N of each multilayered stacked semiconductor material structure 20.

The oxide can be formed utilizing any deposition process including those mentioned above in forming the isolation structures. The planarizing process may comprise chemical mechanical polishing followed by an etch process.

Referring now to FIGS. 10A-10D, there are shown the structure of FIGS. 9A-9E after forming a source region 34S on one side of each sacrificial gate material structure 24 and forming a drain region 34D on the other side of each sacrificial gate material structure 24. The source region 34S and the drain region 34D can be formed by first removing exposed portions of each multilayered stacked semiconductor material structure 20 and the underlying exposed portions of the second spacer 30 that are not protected by each sacrificial gate material structure 24 and first spacer 26. The removal of the exposed portions of each multilayered stacked semiconductor material structure 20 and the underlying exposed portions of the second spacer 30 that are not protected by each sacrificial gate material structure 24 and first spacer 26 can comprise an etching process. In one example, a reactive ion etch can be used to remove the exposed portions of each multilayered stacked semiconductor material structure 20 and the underlying exposed portions of the second spacer 30 that are not protected by each sacrificial gate material structure 24 and first spacer 26.

The remaining portions of each second spacer 30 may be referred to herein as a tunnel spacer 30' since each tunnel spacer 30' is located beneath a remaining portion of the semiconductor nanowire template material 18'. As is shown, the sidewall surfaces of each tunnel spacer 30' are located at end portions of each remaining portions of semiconductor nanowire template material 18' and the sidewall surfaces of each tunnel spacer 30' are vertically coincident to sidewall surfaces of each remaining portion of semiconductor nanowire template material 18'.

After the removal of the exposed portions of each multilayered stacked semiconductor material structure 20 and the underlying exposed portions of the second spacer 30 that are not protected by each sacrificial gate material structure 24 and first spacer 26, sidewall surfaces of each remaining portion of semiconductor nanowire template material 18' are exposed.

Next, a semiconductor material is epitaxial grown from the exposed sidewall surfaces of each remaining portion of semiconductor nanowire template material 18'. In one embodiment, the semiconductor material used as the source region 34S and the drain region 34D can comprise a same semiconductor material as that of each remaining portion of semiconductor nanowire template material 18', yet a different semiconductor material than the non-removed portions of the sacrificial semiconductor material 16N. In another embodiment, the semiconductor material used as the source region 34S and the drain region 34D can comprise a different semiconductor material as that of each remaining portion of semiconductor nanowire template material 18' so long as the semiconductor material used in providing the source/drain regions 34S, 34D is different from the non-removed portion of sacrificial semiconductor material 16N.

In addition to including a semiconductor material, the source region 34S and the drain region 34D also include an n-type or p-type dopant. The dopant can be provided during the epitaxial growth process, or after epitaxial growth by one of ion implantation or gas phase doping.

As shown, the upper surface of the source region 34S and the drain region 34D are coplanar to the topmost surface of each multilayered stacked semiconductor material structure 20. As is also shown, the bottommost surface of the source region 34S and drain region 34D are present on an oxide surface portion (i.e., a portion of the feature containing trench isolation structure) that is present on a surface of the semiconductor substrate 10.

Referring now to FIGS. 11A-11D, there are shown the structure of FIGS. 10A-10D after forming a planarized dielectric material 36 atop the source region 34S and atop the drain region 34D, providing a gate cavity 38 by removing each sacrificial gate material structure 24 to expose a topmost layer of a remaining portion of semiconductor nanowire template material 18' of the multilayered stacked semiconductor material structure 20, and removing the non-removed portions of each sacrificial semiconductor material 16N of the multilayered stacked semiconductor material structure 20.

Prior to removing each sacrificial gate material structure 24 from the structure, the planarized dielectric material 36 has an upper surface that is coplanar with an upper exposed surface of each sacrificial gate material structure 24. In some embodiments, the planarized dielectric material 36 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the planarized dielectric material 36. The use of a self-planarizing dielectric material as planarized dielectric material 36 may avoid the need to perform a subsequent planarizing step.

In one embodiment, the planarized dielectric material 36 can be formed utilizing a conventional deposition process including, for example, chemical vapor deposition (CVD), plasma enhanced chemical vapor deposition (PECVD), evaporation and spin-on coating. In some embodiments, particularly when non-self-planarizing dielectric materials are used, a planarization process or an etch back process follows the deposition of the dielectric material. The thickness of the planarized dielectric material 36 that can be employed in the present application may vary depending on the type of dielectric material employed as well as the method that was employed in forming the same. In one embodiment, the planarized dielectric material 36 has a thickness from 80 nm to 500 nm. Other thicknesses that are greater or lesser than the range provided above can also be used for the planarized dielectric material 36.

Each gate cavity 38 can be formed by removing each of the sacrificial gate material structures 24 from the structure. Each sacrificial gate material structure 24 can be removed by etching. In one example, a reactive ion etch can be used to removal each sacrificial gate material structure 24.

The non-removed portions of each sacrificial semiconductor material 16N of the multilayered stacked semiconductor material structure can then be removed by etching. In one embodiment of the present application, the etch includes an HCl vapor etch. The etch removes the previously non-removed portions of each sacrificial semiconductor material 16N from beneath each remaining portion of semiconductor nanowire template material 18'. Each remaining portion of semiconductor nanowire template material 18' can now be referred to as a semiconductor nanowire 40. Semiconductor nanowires that are located within a same region of the structure collectively can be referred to as a stacked nanowire array 50. As shown, each semiconductor nanowire 40 within a stacked semiconductor nanowire array 50 is vertically spaced apart from each other. Tunnel spacers 30' are located beneath each semiconductor nanowire 40 within the stacked semiconductor array 50. In some cases, an uppermost surface of the tunnel spacer 30' directly contact a bottommost surface of an overlying semiconductor nanowire 40, while a bottommost surface of the tunnel spacer 30' contacts an uppermost surface of an underlying semiconductor nanowire 40. In some cases, the bottommost semiconductor nanowire 40 of a stacked semiconductor nanowire array 50 is separated from an oxide surface portion (i.e., a portion of the feature containing trench isolation structure) that is present on a surface of the semiconductor substrate 10 by a tunnel spacer. Each vertically spaced apart semiconductor nanowire 40 within a given stacked semiconductor nanowire array 50 is connected to a corresponding source region 34S and corresponding drain region 34D. Gap 42 is present beneath each of the vertically spaced apart nanowires.

Referring now to FIGS. 12A-12D, there are shown the structure of FIGS. 11A-11D after forming a gate dielectric 44 and a gate conductor 46 within the gate cavity 38 and within each gap 42. The gate dielectric and gate conductor taken together form a first gate structure within the gate cavity 38 and a second gate structure within each gap 42.

In each gate cavity 38, the gate dielectric 44 is U-shaped having a bottommost portion in direct contact with an upper surface of the topmost semiconductor nanowire 40 and vertical portions that are located on exposed sidewalls of the first spacers 26. Within each gap 42, gate dielectric 44 surrounds gate conductor 46.

The gate dielectric 44 can be a high k material having a dielectric constant greater than silicon oxide. Exemplary high k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g. silicon oxide, and a high k gate dielectric can be formed.

The gate dielectric 44 can be formed by any deposition technique including, for example, chemical vapor deposition (CVD), plasma enhanced chemical vapor deposition (PECVD), physical vapor deposition (PVD), and sputtering, atomic layer deposition. In one embodiment of the present application, the gate dielectric 44 can have a thickness in a range from 1 nm to 10 nm. Other thicknesses that are lesser than or greater than the aforementioned thickness range can also be employed for the gate dielectric 44.

After providing the gate dielectric 44, the gate conductor 46 can be formed atop the gate dielectric 44 and filling the remaining space of each gate cavity 38 and each gap 42. The gate conductor 46 can include any conductive metal material including, for example, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) and multilayered combinations thereof. The gate conductor 46 can be formed utilizing a deposition process including, for example, chemical vapor deposition (CVD), plasma enhanced chemical vapor deposition (PECVD), physical vapor deposition (PVD), sputtering, atomic layer deposition (ALD) and other like deposition processes. When a metal silicide is formed, a conventional silicidation process is employed. In one embodiment, the gate conductor 46 has a thickness from 1 nm to 100 nm. Other thicknesses that are lesser than or greater than the aforementioned thickness range can also be employed for the gate conductor 46.

FIGS. 12A-12D illustrate a semiconductor structure of the present application that has reduced capacitance. The structure includes at least one stacked semiconductor nanowire array 50 suspended above a surface of a semiconductor substrate 10, wherein the at least one stacked semiconductor nanowire array 50 includes a plurality of vertically spaced apart semiconductor nanowires 40. The structure also includes a tunnel spacer 30' located beneath and at end portions of each vertically spaced apart semiconductor nanowire 40 of the at least one stacked semiconductor nanowire array 50, wherein a sidewall surface of each tunnel spacer 30' is vertically coincident with a sidewall surface of each vertically spaced apart semiconductor nanowire 40 of the at least one stacked semiconductor nanowire array 50. The structure also includes a first gate structure within gate cavity 38 and located above a topmost vertically spaced apart semiconductor nanowires 40 of the at least one stacked semiconductor nanowire array 50. The structure further includes a second gate structure within gaps 42 and located beneath each vertically spaced apart semiconductor nanowire 40 of the at least one stacked semiconductor nanowire array 50 and located between each tunnel spacer 30'.

The structure also includes planarized dielectric material 36 located above the source region 34S and the drain region 34D, wherein a dielectric spacer (i.e., first spacer 26) separates the planarized dielectric material 36 located above the source region 34S from a sidewall surface of the first gate structure, and wherein another dielectric spacer (i.e. another first spacer 26) separates the planarized dielectric material 36 located above the drain region 34D from another sidewall surface of the first gate structure. The upper surface of the planarized dielectric material 36 located above the source region 34S and the drain region 34D is coplanar with an upper surface of the first gate structure.

In another embodiment, a block mask can be formed in one of device region of the structure, at least one first gate structure can be formed in the another of the device regions not including the block mask, the block mask is removed, another block mask is formed in the device region including the at least one first gate structure, at least one second gate structure can then be formed into the another device region, and the another block mask can be removed. This particular embodiment permits the formation of at least one first gate structure in one of the device regions that can have at least one different material portion, i.e., gate dielectric material portion and/or gate conductor portion, that differs from the gate dielectric material portion and/or gate conductor portion of the at least one second gate structure formed in the other device region.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:
   providing at least one multilayered stacked semiconductor material structure on a semiconductor substrate and at least one sacrificial gate material structure straddling a portion of the at least one multilayered stacked semiconductor structure, wherein the at least one multilayered stacked semiconductor material structure includes alternating layers of a sacrificial semiconductor material and a semiconductor nanowire template material, said sacrificial semiconductor material is a different semiconductor material than said semiconductor nanowire template material;
   replacing end segments of each layer of sacrificial semiconductor material with a dielectric spacer structure;
   forming a source region and a drain region from exposed sidewall surfaces of each layer of semiconductor nanowire template material and on opposite sides of the at least one sacrificial gate material;
   suspending each layer of semiconductor nanowire template material of the least one multilayered stacked semiconductor material structure by removing the at least one sacrificial gate material structure and remaining portions of the sacrificial semiconductor material; and
   forming a gate structure within areas previously occupied by the at least one sacrificial gate material structure and remaining portions of the sacrificial semiconductor material.

2. The method of claim 1, wherein said providing the least one multilayered stacked semiconductor material structure comprises:
   forming a base sacrificial semiconductor layer on an upper surface of the semiconductor substrate;
   forming a semiconductor material stack comprising alternating layers of said sacrificial semiconductor material, and said semiconductor nanowire template material, with the proviso that at least two layers of each material is present, and that the topmost layer of the semiconductor material stack comprises said semiconductor nanowire template material; and
   patterning the semiconductor material stack and the base sacrificial semiconductor layer by lithography and etching.

3. The method of claim 2, wherein during said etching, trenches are formed within the semiconductor substrate, and wherein said trenches are filled with a trench dielectric material providing trench isolation structures.

4. The method of claim 1, wherein said providing the at least one sacrificial gate material structure comprises:
depositing a blanket layer of sacrificial gate material; and
patterning the blanket layer of sacrificial gate material by lithography and etching.

5. The method of claim 1, wherein other dielectric spacers are formed on exposed sidewall surfaces of the at least one sacrificial gate material structure prior to replacing end segments of each layer of sacrificial semiconductor material with the dielectric spacer.

6. The method of claim 1, wherein said replacing end segments of each layer of sacrificial semiconductor material with the dielectric spacer comprises:
removing said end segments of each layer of sacrificial semiconductor material by etching; and
depositing a spacer material.

7. The method of claim 1, wherein said forming the source region and the drain region from exposed sidewall surfaces of each layer of semiconductor nanowire template material and on opposite sides of the at least one sacrificial gate material structure comprises forming a doped semiconductor material utilizing an in-situ epitaxial deposition process.

8. The method of claim 1, wherein said forming the source region and the drain region from exposed sidewall surfaces of each layer of semiconductor nanowire template material and on opposite sides of the at least one sacrificial gate material structure comprises forming a non-doped semiconductor material by epitaxial growth, and subjecting the non-doped semiconductor material to ion implantation or gas phase doping.

9. The method of claim 1, wherein said gate structure formed in the area previously occupied by the at least one sacrificial gate material structure comprises a U-shaped gate dielectric having a bottommost portion in direct contact with an upper surface of a topmost layer of a suspended semiconductor material and a gate conductor located on the U-shaped gate dielectric.

10. The method of claim 1, wherein each gate structure formed in the area previously occupied by remaining portions of the sacrificial semiconductor material comprises a gate dielectric that surrounds a gate conductor.

* * * * *